United States Patent
Ichiyanagi et al.

(10) Patent No.: US 7,348,069 B2
(45) Date of Patent: *Mar. 25, 2008

(54) CERAMIC SUBSTRATE FOR THIN-FILM ELECTRONIC COMPONENTS, METHOD FOR PRODUCING THE SUBSTRATE, AND THIN-FILM ELECTRONIC COMPONENT EMPLOYING THE SUBSTRATE

(75) Inventors: Seiji Ichiyanagi, Aichi (JP); Jun Otsuka, Aichi (JP); Manabu Sato, Aichi (JP); Masahiko Okuyama, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 105 days.

This patent is subject to a terminal disclaimer.

(21) Appl. No.: 10/951,731

(22) Filed: Sep. 29, 2004

(65) Prior Publication Data
US 2005/0078433 A1    Apr. 14, 2005

(30) Foreign Application Priority Data
Sep. 29, 2003    (JP)    ............................. 2003-338699

(51) Int. Cl.
C03C 27/02    (2006.01)
B32B 3/00     (2006.01)
G03C 5/00     (2006.01)

(52) U.S. Cl. ...................... 428/631; 428/142; 428/210; 428/307.7; 428/410; 428/428; 428/446; 428/901; 361/306.3; 361/321.2; 361/762; 361/763; 430/313

(58) Field of Classification Search ................ 428/210, 428/142, 410, 427–428, 446, 631, 702, 901; 361/321.2, 306.3; 430/313
See application file for complete search history.

(56) References Cited

U.S. PATENT DOCUMENTS

| | | | | |
|---|---|---|---|---|
| 4,396,682 A | * | 8/1983 | Mohri et al. | ................. 428/428 |
| 4,634,634 A | * | 1/1987 | Kondo et al. | ............... 428/432 |
| 4,767,672 A | * | 8/1988 | Fujinaka et al. | ............ 428/446 |
| 4,806,334 A | * | 2/1989 | Fujinaka et al. | ............ 428/631 |
| 6,320,738 B1 | * | 11/2001 | Yamana et al. | .......... 361/321.2 |

FOREIGN PATENT DOCUMENTS

| | | |
|---|---|---|
| JP | 2001-044073 A | 2/2001 |
| JP | 2003-017301 A | 1/2003 |

* cited by examiner

*Primary Examiner*—Cathy F. Lam
(74) *Attorney, Agent, or Firm*—Sughrue Mion Pllc.

(57) ABSTRACT

A first ceramic substrate includes a substrate (2) and a glaze layer (3), wherein the glaze layer has a surface having an Ra of 0.02 μm or less and a Ry of 0.25 μm or less. A second ceramic substrate is formed by subjecting a glass layer (24) formed on a surface of a substrate (2) to heating-and-pressurizing treatment, thereby forming a glaze layer (3) on the substrate (2), and planarization-polishing the surface of the glaze layer. A third ceramic substrate includes a substrate (2), a glaze layer (3) containing substantially no pores formed on the substrate (2) and the surface thereof being planarization-polished, and a wiring pattern (21), wherein at least one first end of the wiring pattern is exposed to the glaze layer (3) surface of the substrate (1), and at least one second end is exposed to another surface of the substrate (1).

12 Claims, 17 Drawing Sheets

100 μm

CERAMIC SUBSTRATE FOR THIN-FILM ELECTRONIC COMPONENTS, METHOD FOR PRODUCING THE SUBSTRATE, AND THIN-FILM ELECTRONIC COMPONENT EMPLOYING THE SUBSTRATE

BACKGROUND OF THE INVENTION

1. Field of the Invention

The present invention relates to a ceramic substrate for thin-film electronic components, to a method for producing the ceramic substrate, and to a thin-film electronic component employing the substrate. More particularly, the invention relates to a ceramic substrate having excellent surface smoothness for use in thin-film electronic components, to a method for producing the ceramic substrate, and to a thin-film electronic component employing the substrate.

2. Description of the Related Art

In recent years, there has been a keen demand for thin-film electronic components making use of a thin film member; e.g., a thin-film capacitor having small dimensions and large capacitance. These thin-film electronic components; for example, thin-film capacitors, are required to contain a conductor layer and a dielectric layer of as small a thickness as possible. Therefore, these layers are generally formed through a thin-film formation technique such as a sputtering method, a CVD method, or a sol-gel method. During formation of these thin layers, surface conditions of a substrate on which thin film is to be formed are key factors. When the substrate has a surface of poor flatness, desired characteristics cannot be reliably attained, and various other problems also arise, such as insufficient interlayer insulation. In this connection, there have been known substrates for providing a surface of high flatness, and the below-described Patent Documents 1 and 2 disclose a glazed ceramic substrate which is produced by coating a ceramic substrate with a glass material.

Patent Document 1

Japanese Patent Application Laid-Open (kokai) 2001-044073

Patent Document 2

Japanese Patent Application Laid-Open (kokai) 2003-017301

3. Problems to be Solved by the Invention

The aforementioned Patent Document 1 discloses that a planarization film such as a glass coating may be deposited in order to enhance flatness. The above Patent Document 2 discloses that a glazed alumina substrate successfully provides a flat surface. However, as described in Patent Document 2, even when a conventional glazed ceramic substrate formed of high-purity (99.5% or higher) alumina is employed, the arithmetical mean roughness (Ra) of the surface of the glazed ceramic substrate is at best about 30 nm. In consideration of the requirements for thin-film electronic components in recent years, a surface of higher flatness is in demand, but attainment thereof through a conventional technique has been difficult.

SUMMARY OF THE INVENTION

The present invention has been achieved in view of the foregoing. Thus, an object of the invention is to provide a ceramic substrate for thin-film electronic components which can provide a surface of remarkably high flatness, with high reliability, in a simple manner, and at low cost. Another object of the invention is to provide a method for producing the ceramic substrate. Still another object of the invention is to provide a thin-film electronic component employing the substrate.

The present inventors previously studied glazed substrates, and found that the quality of planarization of glazed substrates greatly depends on the presence of bubbles which are readily incorporated into glass. Glazed substrates are produced by applying glass paste to a substrate and heating the applied glass paste, to thereby form a glass layer. However, since molten glass has a high viscosity, an organic substance is difficult to remove from the paste through a conventional firing technique without incorporating bubbles into the glass. Since there may be some cases in which a stacked structure including a conductor layer formed directly on the thus-formed glass layer is provided, the composition of the glass cannot be selected from only the viewpoint of heating and removal of bubbles.

In view of the foregoing, the present inventors have carried out extensive studies on a method for producing a glazed ceramic substrate which enables provision of a surface of remarkably high flatness, with high reliability and in a simple manner, and which allows a wide range of raw materials to be employed, and have found that the aforementioned problems can be solved by heating and pressurizing the applied glass paste, thereby forming a surface of surprisingly high flatness, as compared with the surface roughness of conventional glazed ceramic substrates. The present inventors have further found that, according to the method, a surface of high-flatness can also be formed even by using a generally employed inexpensive substrate of high surface roughness on which a glaze layer is to be formed. The present invention has been accomplished on the basis of these findings.

Accordingly, the present invention is directed to the following.

(1) A ceramic substrate for thin-film electronic components, the substrate including a base ceramic substrate, and a glaze layer formed on at least one surface of the base ceramic substrate, characterized in that the glaze layer has a surface having an arithmetical mean roughness (Ra) of 0.02 µm or less and a maximum height (Ry) of 0.25 µm or less (hereinafter the ceramic substrate is also referred to as "a first ceramic substrate for thin-film electronic components according to the present invention").

(2) A ceramic substrate for thin-film electronic components as described in (1) above, wherein the glaze layer has a thickness of 10 to 100 µm.

(3) A ceramic substrate for thin-film electronic components as described in (1) or (2) above, wherein the glaze layer is formed of a glass having a sag point of 700° C. or higher.

(4) A ceramic substrate for thin-film electronic components as described in any of (1) to (3) above, wherein the glaze layer is formed of a glass containing as predominant components Si, Al, B, Ca, and O.

(5) A ceramic substrate for thin-film electronic components, characterized in that the substrate is formed by subjecting a glass layer formed on a surface of a base ceramic substrate to heating-and-pressurizing treatment, thereby forming a glaze layer on the base ceramic substrate, and planarization-polishing the surface of the glaze layer (hereinafter the ceramic substrate is also referred to as "a second ceramic substrate for thin-film electronic components according to the present invention").

(6) A ceramic substrate for thin-film electronic components as described in (5) above, wherein the heating-and-pressurizing treatment is performed at 700° C. or higher and 0.5 MPa or higher.

(7) A ceramic substrate for thin-film electronic components as described in (5) or (6) above, wherein the glass layer is formed of a glass having a sag point of 750° C. or higher.

(8) A ceramic substrate for thin-film electronic components as described in any of (5) to (7) above, wherein the glass layer is formed of a glass containing as predominant components Si, Al, B, Ca, and O.

(9) A ceramic substrate for thin-film electronic components, the substrate including a base ceramic substrate, and a glaze layer containing no pores and formed on at least one surface of the base ceramic substrate, characterized in that a surface of the glaze layer has been planarization-polished (hereinafter the ceramic substrate is also referred to as "a third ceramic substrate for thin-film electronic components according to the present invention").

(10) A ceramic substrate for thin-film electronic components as described in any of (1) to (9) above, which contains a wiring pattern inside the substrate.

(11) A thin-film electronic component, comprising a ceramic substrate for thin-film electronic components as described in any of (1) to (10) above.

(12) A thin-film electronic component as described in (11) above, which has a capacitor portion composed of capacitor conductive layers and a capacitor dielectric layer which are stacked on the ceramic substrate for thin-film electronic components, wherein the capacitor portion is formed by alternatingly stacking the capacitor conductive layers and the capacitor dielectric layer such that the capacitor dielectric layer is disposed between two of the capacitor conductor layers opposing each other.

(13) A method for producing a ceramic substrate for thin-film electronic components, characterized in that the method comprises the following steps, in the order given:

a resist layer forming step for forming a resist layer on a surface of a base ceramic substrate having an interior wiring pattern whose end surface is exposed to the surface of the substrate;

a patterning step for patterning the resist layer, thereby forming a patterning hole in communication with the end surface of the interior wiring pattern;

an interior wiring pattern end portion forming step for forming an end portion of the interior wiring pattern, the end portion being connected with the end surface of the interior wiring pattern, by filling the patterning hole with an electroconductive material;

a resist layer removing step for removing the patterned resist layer;

a glass layer forming step for forming a glass layer on a surface of the base ceramic substrate such that at least a portion of the end portion of the interior wiring pattern is buried with the glass layer;

a heating-and-pressurizing step for performing heating-and-pressurizing treatment, thereby forming a glaze layer on a surface of the base ceramic substrate; and a planarization-polishing step for polishing a surface of the glaze layer to provide a flat surface, thereby exposing the end portion of the interior wiring pattern.

(14) A method for producing a ceramic substrate for thin-film electronic components, characterized in that the method comprises the following steps, in the order given:

a glass layer forming step for forming a glass layer on a surface of a base ceramic substrate having an interior wiring pattern whose end surface is exposed to the surface of the substrate;

a heating-and-pressurizing step for performing heating-and-pressurizing treatment, thereby forming a glaze layer on the base ceramic substrate;

a resist layer forming step for forming a resist layer on the glaze layer;

a patterning step for patterning the resist layer, thereby forming a patterning hole in communication with the end surface of the interior wiring pattern;

an etching step for etching the glaze layer through the patterning hole, thereby forming an etching hole connecting with the end surface of the interior wiring pattern;

a resist layer removing step for removing the patterned resist layer;

an interior wiring pattern end portion forming step for forming an end portion of the interior wiring pattern, the end portion being connected with the end surface of the interior wiring pattern, by filling the etching hole with an electroconductive material; and a planarization-polishing step for polishing a surface of the glaze layer to provide a flat surface, thereby exposing the end portion of the interior wiring pattern.

EFFECTS OF THE INVENTION

According to the first ceramic substrate for thin-film electronic components according to the present invention, high-quality thin-film electronic components can be reliably produced by virtue of the substrate having a surface of high flatness, and such components can be produced at low cost.

According to the third ceramic substrate for thin-film electronic components according to the present invention, high-quality thin-film electronic components can be reliably produced by virtue of the substrate having a surface of high flatness, and such components can be produced at low cost.

When the glaze layer has a thickness of 10 to 100 µm, a surface having remarkably high flatness can be obtained, thereby reliably producing high-quality thin-film electronic components.

When the glaze layer is formed of a glass having a sag point of 700° C. or higher, a surface having remarkably high flatness can be obtained, thereby reliably producing high-quality thin-film electronic components. In addition, since the flatness is maintained at a working temperature generally employed in formation of thin-film electronic components from the ceramic substrate, high-quality thin-film electronic components can be reliably produced.

When the glaze layer is formed of a glass containing as predominant components Si, Al, B, Ca, and O, a surface having remarkably high flatness can be obtained, and a conductor layer can be formed directly on the glaze layer, thereby reliably producing high-quality thin-film electronic components.

According to the second ceramic substrate for thin-film electronic components according to the present invention, high-quality thin-film electronic components can be reliably produced by virtue of the substrate having a surface of high flatness, and such components can be produced at low cost.

When the heating-and-pressurizing treatment is carried out at 700° C. or higher and 1 MPa or higher, a surface having remarkably high flatness can be obtained, thereby reliably producing high-quality thin-film electronic components.

When the glass layer is formed of a glass having a sag point of 750° C. or higher, a surface having remarkably high flatness can be obtained, thereby reliably producing high-quality thin-film electronic components. In addition, since the flatness is maintained at a working temperature generally employed in formation of thin-film electronic components from the ceramic substrate, high-quality thin-film electronic components can be reliably produced.

When the glass layer is formed of a glass containing as predominant components Si, Al, B, Ca, and O, a surface having remarkably high flatness can be obtained, and a conductor layer can be formed directly on the glaze layer, thereby reliably producing high-quality thin-film electronic components.

When the ceramic substrate contains a wiring pattern inside the substrate, another electronic component can be mounted on the produced thin-film electronic component, thereby serving as a ceramic substrate for fabricating smaller-scale thin-film electronic components.

The thin-film electronic component of the present invention has high flatness and reliability by virtue of employing a substrate having a surface of high flatness.

When a thin-film electronic component is composed of the ceramic substrate of the present invention for thin-film electronic components and a predetermined capacitor portion provided on the substrate, stable electric characteristics can be attained without short-circuiting, thereby attaining a capacitor function of high reliability.

According to a first method for producing a ceramic substrate of the present invention for thin-film electronic components, a ceramic substrate having a surface of high flatness for thin-film electronic components can be produced reliably and readily.

According to a second method for producing a ceramic substrate of the present invention for thin-film electronic components, a ceramic substrate having a surface of high flatness for thin-film electronic components can be produced reliably and readily.

DESCRIPTION OF REFERENCE NUMERALS

Figure 1:
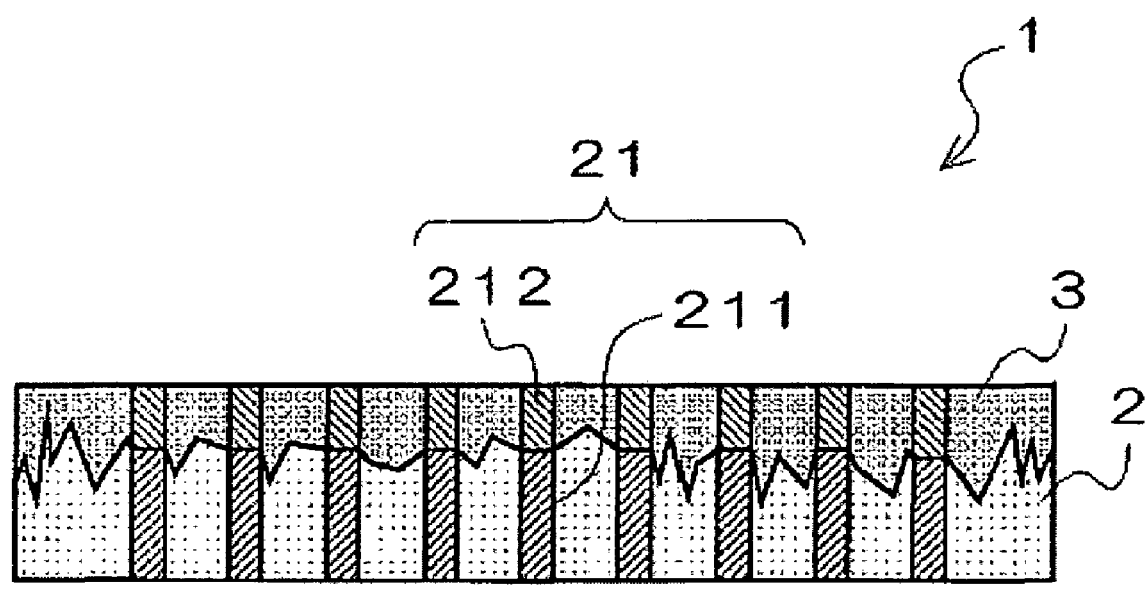
FIG. 1 is a schematic cross section of the ceramic substrate of the present invention for thin-film electronic components.

Reference numerals used to identify various structural features in the drawings include the following.
1 ceramic substrate for thin-film electronic components
2 base ceramic substrate
21 wiring pattern (via conductor)
211 interior wiring pattern
212 interior wiring pattern end portion
22 photoresist layer
221 patterning hole
23 glass paste layer
24 glass layer
241 void
3 glaze layer
31 etching hole
100 thin-film capacitor (thin-film electronic component)
4 capacitor conductor layer
5 etching resist (for conductor layer)
6 capacitor dielectric layer (starting dielectric material)
7 etching resist (for dielectric layer)
8 capacitor conductor layer
9 etching resist (for conductor layer)
10 solder resist layer
11 nickel-gold plating layer
12 solder ball.

DETAILED DESCRIPTION OF THE PREFERRED EMBODIMENTS

The present invention will next be described in greater detail.

[1] Ceramic Substrate for Thin-film Electronic Components

The first ceramic substrate for thin-film electronic components according to the present invention, the substrate including a base ceramic substrate, and a glaze layer formed on at least one surface of the base ceramic substrate, is characterized in that the glaze layer has a surface having an arithmetical mean roughness (Ra) of 0.02 μm or less and a maximum height (Ry) of 0.25 μm or less.

The aforementioned "base ceramic substrate" serves as a base member of the ceramic substrate for a thin-film electronic component and also supports the below-mentioned glaze layer. The base ceramic substrate may be composed of one layer or two or more layers, and may or may not contain an interior wiring pattern.

No particular limitation is imposed on the ceramic component for forming the base ceramic layer, but ceramic components having excellent heat resistance and mechanical strength are preferred. Among these ceramic components, examples of those serving as predominant components (hereinafter also referred to as "predominant ceramic component," which is generally contained in an amount of 40 mass % or more based on the total ceramic components) include alumina, zirconia, silica, and magnesia. Of these, alumina is preferred, since alumina has excellent characteristics such as insulation property, heat resistance, mechanical strength and thermal stability, finds a wide range of use, and can be obtained at low cost.

When alumina is contained as a predominant ceramic component in the ceramic substrate, no particular limitation is imposed on the amount of alumina. The amount of alumina is preferably 40 mass % or more (more preferably 70 to 99 mass %, most preferably 85 to 98 mass %) based on the entire ceramic portion (100 mass %) excluding a glass-ceramic mixture layer (a mixture layer formed by incorporating a glass into the surface of the base ceramic substrate through permeation) and, if present, an interior wiring pattern or a similar element. When the amount is 40 mass % or more, the aforementioned characteristics of alumina are fully attained.

Other than predominant ceramic components, auxiliary ceramic components such as magnesia, calcia, silica, and boric acid may be incorporated into the ceramic substrate (generally in an amount of less than 40 mass %). Note that the predominant ceramic components and the auxiliary ceramic components are chemically different species. In addition to the predominant and the auxiliary ceramic components, a ceramic component derived from a sintering agent or a similar substance may be incorporated into the ceramic substrate. The predominant components may be incorporated singly or in combination of two or more species, and so may be the auxiliary components and other ceramic components.

No particular limitation is imposed on the roughness of the surface on which the glaze layer of the base ceramic substrate is formed, and the roughness may be of such a level as not to form protrusions from the below-mentioned glaze layer. In other words, the maximum height (Ry) is essentially smaller than the thickness of the glaze layer (generally, the thickness after polishing). For example, when the glaze layer has a thickness of 50 μm, the surface of the base ceramic substrate may have a (Ry) of less than 50 μm. No particular limitation is imposed on the shape and dimensions of the base ceramic substrate. No particular limitation is imposed on the thickness of the base ceramic substrate, and the thickness is generally 200 μm or more, (preferably 200 to 2,000 μm, more preferably 300 to 1,000 μm). When the thickness is 200 μm or more, the ceramic substrate for thin-film electronic components thus produced can be imparted with sufficient mechanical strength.

The aforementioned "glaze layer" is a glass layer having a surface having an arithmetical mean roughness (Ra) of 0.02 μm or less and a maximum height (Ry) of 0.25 μm or less. The glaze layer may be formed on one surface or both surfaces of the base ceramic substrate. The surface may have an Ra of 0.015 μm or less and an Ry of 0.25 μm or less, or even may have an Ra of 0.010 μm or less and an Ry of 0.20 μm or less. Polishing for obtaining the surface may or may not be performed. However, polishing is generally performed, in order to obtain the aforementioned remarkably flat surface conditions.

Preferably, the glaze layer has no pores. The term "no pores" means a state in which pores having a longer diameter of 0.2 μm or more are not observed in at least 10 different squares (100 μm×100 μm) arbitrarily selected from a stacking layer plane. In other words, the glaze layer is a remarkably dense layer having virtually no pores. The term "stacking layer plane" refers to a cross-section in a direction normal to the stacking direction of the glaze layer on the base ceramic substrate. For identification, the images are generally observed at a magnification of 2,000 or more. The glaze layer may be formed on one surface or on both surfaces of the base ceramic substrate.

No particular limitation is imposed on the glass for forming the glaze layer, but glass components having excellent heat resistance, insulation performance, and mechanical strength are preferred. Generally, the glass component for forming the glass essentially contains Si, Al, and O. Other than these elements, the glass component may include B, Ca, Mg, Sr, Ba, V, Cr, Mn, Co, Ni, Ga, Y, Zr, Nb, Mo, Tc, In, Sn, Ta, W, Re, Bi, lanthanoid elements, and actinoid elements. Among these elements, B, Ca, Mg, Ba, and similar elements are preferred, with B and Ca being more preferred. These elements may be included singly or in combination of two or more elements, and may be incorporated in the form of a complex oxide containing two or more of the metallic elements. In contrast, preferably, elements such as alkali metal elements, P, and Pb are substantially not incorporated into the glass. Particularly when excellent insulation performance is imparted to the glass, the glass preferably contains no transition metals among the aforementioned elements.

Particularly preferably, the glass contains Si, Al, B, Ca, and O as predominant components. Specifically, the glass preferably contains Si, Al, B, and Ca in a total amount (as reduced to $SiO_2$, $Al_2O_3$, $B_2O_3$, and CaO) of 80 mass % or more (more preferably 90 mass % or more, most preferably 95 mass % or more based on the entire glaze layer (100 mass %)).

Furthermore, the glass contains Si in an amount (as reduced to $SiO_2$) of 50 to 70 mass % (more preferably 55 to 65 mass %) and Al in an amount (as reduced to $Al_2O_3$) of 3 to 15 mass % (more preferably 5 to 10 mass %) based on the entire glass (100 mass %). Also, the glass contains B in an amount (as reduced to $B_2O_3$) of 10 to 30 mass % (more preferably 15 to 25 mass %) and Ca in an amount (as reduced to CaO) of 3 to 20 mass % (more preferably 5 to 15 mass %) based on the entire glass (100 mass %).

No particular limitation is imposed on the glass transition point, but the glass transition point is preferably 600° C. or higher (more preferably 630° C. or higher, generally 700° C. or lower).

No particular limitation is imposed on the softening point of the glass, but the softening point is preferably 750° C. or higher (more preferably 800° C. or higher, generally 1,200° C. or lower).

No particular limitation is imposed on the sag point of the glass, but the sag point is preferably 750° C. or higher (more preferably 800° C. or higher, generally 1,200° C. or lower). The working temperature employed in the production of thin-film electronic components from the ceramic substrate of the invention for thin-film electronic components is generally about 700° C. at most. Therefore, when the sag point is 750° C. or higher, the surface flatness of the glaze layer is satisfactorily maintained. Such a high sag point is suitable for a process including a post-treatment step in which the glass forming the glaze layer is heated to 700° C. or higher. Examples of the post-treatment step include a capacitor portion formation step based on the sol-gel method. Notably, the glass is required to have a sag point of 700° C. or higher, and therefore, a glass having a sag point of 700 to 800° C. may be employed.

No particular limitation is imposed on the shape and dimensions of the glaze layer. No particular limitation is imposed on the thickness of the glaze layer, and the thickness is preferably 100 μm or less, (more preferably 70 μm or less, most preferably 50 μm or less, generally 10 μm or more). Since the surface of the glaze layer is generally planarized by polishing, the glaze layer is required to have such a thickness as not to expose the base ceramic substrate during polishing. Generally, the thickness must be at least 10 μm in order to ensure flatness after polishing. When the thickness falls within the aforementioned range, the height of an end portion of the interior wiring pattern formed in the glaze layer can be suppressed, in the case in which the below-mentioned interior wiring pattern is provided.

The surface of the glaze layer is generally planarized by polishing. No particular limitation is imposed on the polishing method, and the surface roughness is remarkably reduced through polishing. The glaze layer has a certain surface roughness; i.e., an arithmetical mean roughness (Ra) of 0.02 μm or less and a maximum height (Ry) of 0.25 μm or less. The surface may have an Ra of 0.015 μm or less and an Ry of 0.25 μm or less, or even may have an Ra of 0.010 gum or less and an Ry of 0.20 μm or less. Notably, (Ra) and (Ry) are defined and measured, as specified in JIS B0601 (1994), incorporated herein by reference.

The glaze layer has a higher density as compared with a conventional glaze layer. By virtue of its high density, the aforementioned surface roughness can be attained. The term "dense or high density" refers to a state in which the top surface of the glaze layer (generally the top surface resulting from polishing) contains no pores.

The ceramic substrate of the present invention for thin-film electronic components may contain an interior wiring pattern. The aforementioned "wiring pattern" is formed at least inside the ceramic substrate of the present invention for thin-film electronic components. Examples of the wiring pattern include a via wiring (reference numeral 21 in FIG. 14) formed in a ceramic substrate for thin-film electronic components. The via wiring is a type of wiring pattern which electrically connects, for example, the top surface and the bottom surface of the ceramic substrate for thin-film electronic components. No particular limitation is imposed on the conductive material for forming the via wiring, and materials such as tungsten, molybdenum, gold, platinum, silver, palladium, copper, and nickel may be employed. These conductive materials may be used singly or in combination of two or more species.

No particular limitation is imposed on the shape of the via wiring, and the via wiring generally assumes the form of a column penetrating the component layers in the glaze layer stacking direction. No particular limitation is imposed on the diameter of the column, and the diameter may be 50 to 200 μm.

In addition to the aforementioned via wiring, a wiring pattern may be formed in the plane direction, which is similar to an electrode layer for forming a thin-film electronic component. Examples of the wiring pattern include typical wiring for conduction, wiring for resistance, wiring for inductance, and bonding pads.

The second ceramic substrate for thin-film electronic components according to the present invention is characterized in that the substrate is formed by subjecting a glass layer formed on a surface of a base ceramic substrate to heating-and-pressurizing treatment, thereby forming a glaze layer on the base ceramic substrate, and planarization-polishing the surface of the glaze layer.

The same base ceramic substrate as employed in the first ceramic substrate for thin-film electronic components may be used as the aforementioned "base ceramic substrate" without modification. Although an as-fired ceramic substrate may be employed as the base ceramic substrate without modification, the substrate is preferably polished, before use, to such an extent as to remove surface irregularities such as warpage intrinsic to ceramic material, thereby providing a flat surface.

The aforementioned "glaze layer" is produced through heating-and-pressuring. Generally, the glaze layer is equivalent to the glaze layer of the first ceramic substrate for thin-film electronic components or the glaze layer of the below-mentioned third ceramic substrate for thin-film electronic components.

The glaze layer of the first ceramic substrate for thin-film electronic components can be employed as the glaze layer without modification. In this case, however, the surface roughness is not limited. The surface roughness (Ra) may be controlled to 0.02 μm or less (further 0.015 μm or less, even further 0.010 μm or less), or the surface roughness (Ry) may be controlled to 0.25 μm or less (further 0.20 μm or less). Furthermore, the two parameters may be controlled to Ra of 0.02 μm or less and Ry of 0.25 μm or less (further Ra of 0.015 μm or less and Ry of 0.25 μm or less, even further, Ra of 0.010 μm or less and Ry of 0.20 μm or less). The glass layer can be controlled so that pores having a longer diameter of 0.2 μm or more are not observed in at least 10 different squares (100 μm×100 μm) arbitrarily selected from a stacking layer plane.

The aforementioned "glass layer" is formed of a glass which has not been subjected to heating-and-pressurizing treatment. The glass layer generally contains voids (the same meaning as pores). Briefly, the glass layer differs from the glaze layer, which has undergone heating-and-pressurizing treatment, in terms of the presence of pores. The glass forming the "glaze layer" of the first ceramic substrate for thin-film electronic components may be employed without modification as the glass for forming the glass layer. No particular limitation is imposed on the shape and dimensions of the glass layer. No particular limitation is imposed on the thickness of the glass layer, but the thickness of the glass layer in a solidified state is preferably larger than the maximum height (Ry) of the base ceramic substrate by 10 μm or more. For example, the thickness may be 0.05 to 1 mm. No particular limitation is imposed on the method of forming the glass layer. For example, a layer containing the below-mentioned glass powder may be baked to form the glass layer.

Baking is a process of heating a layer containing glass powder to a temperature higher than the softening point of the glass forming the glass powder, thereby forming a glass layer. The baking is performed at an appropriate temperature in accordance with the composition of the employed glass. For example, when the glass has a sag point of about 700 to 780° C., the baking temperature is preferably 800 to 1,200° C. (more preferably 900 to 1,100° C.). No particular limitation is imposed on the atmosphere for baking, and preferably, the atmosphere is appropriately selected on the basis of, for example, a conductive material forming an interior wiring pattern included in a base ceramic substrate. For example, when the conductive material is predominantly composed of gold and platinum, baking is preferably performed under atmospheric conditions, whereas when the conductive material contains, as predominant components, highly oxidizable materials such as copper, nickel, tungsten, and molybdenum, baking is preferably performed in a non-oxidizing atmosphere.

No particular limitation is imposed on the shape, dimensions, and thickness of the layer containing glass powder.

The glass powder contained in this layer is composed of the "glass for forming the glaze layer" of the first ceramic substrate for thin-film electronic components. The shape and dimensions of the powder particles are not particularly limited. Generally, glass powder particles having a mean particle size of 0.1 to 100 μm are employed. The powder having such a particle size is readily softened and handled.

No particular limitation is imposed on the method for forming the layer containing glass powder. For example, the layer may be formed by applying a paste containing glass powder (hereinafter also referred to as "glass paste") to a substrate. Alternatively, a base ceramic substrate is placed in a slurry in which glass powder is dispersed, and the glass powder is subjected to sedimentation, followed by removing the ceramic substrate from the slurry and drying. Yet alternatively, a layer solely containing glass powder is formed by, for example, sprinkling glass powder directly on a substrate. Among these methods, application of a glass paste is preferred from the viewpoint of workability or other factors.

In addition to the glass powder, an organic component is generally incorporated into the glass paste in actual use. The organic component imparts properties such as moldability to the glass paste. Generally, a binder is employed as the organic component, and examples of the binder include ethyl cellulose resin, butyral resin, and acrylic resin. These resins may be used singly or in combination of two or more species. In addition, a plasticizer, a dispersing agent, a solvent, etc., may be incorporated into the paste. These additives may be used singly or in combination of two or more species. Into the glass paste, other components, which may be inorganic or organic, such as a dispersing agent, a leveling agent, a lubricant, a defoaming agent, and an anti-oxidant may be incorporated. These components may be used singly or in combination of two or more species.

No particular limitation is imposed on the viscosity of the glass paste, and the viscosity is adjusted to, for example, 1 to 1,000 Pa·s (more preferably 20 to 500 Pa·s).

No particular limitation is imposed on the method for applying a glass paste, and preferably, the method is appropriately selected on the basis of viscosity and other properties of the glass paste. For example, when the glass paste has a viscosity of 1 to 1,000 Pa·s as described above, the paste may be applied through screen printing, the doctor blade method, curtain coater printing, or other methods. Of these, screen printing and the doctor blade method are preferred. When the viscosity is less than the lower limit of the aforementioned viscosity range, the paste may be applied through spin coating, dip coating, spraying (ink-jet, thermal, etc.) or other methods.

The aforementioned "heating-and-pressurizing" refers to a treatment of heating a glass layer while pressure is applied to the glass layer. No particular limitation is imposed on the heating method and the pressurizing method. For example, pressurization may be performed isotropically or uniaxially. The pressure medium may be any of gas, powder, and liquid. Of these, isotropically pressing with a gas pressure medium is preferred. Examples of such methods include a hot isostatic pressing method (hereinafter also referred to as "HIP method").

Upon heating-and-pressurizing treatment of the glass layer, the treatment may be performed with respect to the glass layer of an almost solidified state. However, preferably, the glass is preliminary heated to render the glass a fluid state. The fluid state is suitable for effectively removing voids present in the glass. The "fluid state" generally refers to a state in which the glass is heated to have a temperature ($\geq T_{-100}$) higher than a temperature that is lower by 100° C. than the sag point ($T_{-100}$) of the glass forming the glass layer.

When the aforementioned layer containing glass powder is employed, the preliminary heating before heating-and-pressurizing treatment may be performed separately or continuously with the step of baking the glass-containing layer to form a glass layer. Furthermore, the preliminary heating may be performed continuously or separately with the heating-and-pressurizing.

No particular limitation is imposed on the heating temperature of the heating-and-pressurizing treatment, and the temperature is preferably controlled to an appropriate level in accordance with the characteristics of the glass that is employed. Generally, the temperature is 700° C. or higher (preferably 750 to 1,000° C., more preferably 750 to 900° C.). No particular limitation is also imposed on the pressurization pressure, and the pressure is preferably controlled to an appropriate level in accordance with the characteristics of the glass that is employed. Generally, the pressure is 0.5 MPa or higher (preferably 0.5 to 200 MPa, more preferably 0.5 to 50 MPa). The combination of the heating temperature and applied pressure is preferably 700° C. or higher and 0.5 MPa or higher, more preferably 750 to 1,000° C. and 0.5 to 200 MPa, most preferably 750 to 900° C. and 0.5 to 50 MPa.

The aforementioned "planarization-polishing" is a step of polishing a surface of the glaze layer which has been provided through heating-and-pressurizing treatment, thereby forming a flat glaze layer surface. No particular limitation is imposed on the polishing method, and mechanical polishing, chemical mechanical polishing, or chemical polishing may be employed. Of these, mechanical polishing and chemical mechanical polishing are preferred.

The third ceramic substrate for thin-film electronic components of the present invention, the substrate including a base ceramic substrate and a glaze layer containing no pores and formed on at least one surface of the base ceramic substrate, is characterized in that a surface of the glaze layer has been planarization-polished.

The same base ceramic substrate as employed in the first ceramic substrate for thin-film electronic components may be used as the aforementioned "base ceramic substrate" without modification.

The aforementioned "glaze layer" has no pores. The term "no pores" means a state in which pores having a longer diameter of 0.2 μm or more are not observed in at least 10 different squares (100 μm×100 μm) arbitrarily selected from a stacking layer plane. In other words, the glaze layer is a remarkably dense layer having virtually no pores. The term "stacking layer plane" refers to a cross-section in a direction normal to the stacking direction of the base ceramic substrate. For identification, the images are observed generally at a magnification of 2,000 or more. The glaze layer may be formed on one surface or both surfaces of the base ceramic substrate.

The glaze layer is subjected to planarization polishing. The same planarization polishing as described in relation to the second ceramic substrate for thin-film electronic components may be performed as the aforementioned "planarization polishing" without modification.

No particular limitation is imposed on the surface roughness of the glaze layer, and the layer preferably has a surface having an arithmetical mean roughness (Ra) of 0.02 μm or less and a maximum height (Ry) of 0.25 μm or less. The surface may have an Ra of 0.015 μm or less and an Ry of 0.25 μm or less, particularly and Ra of 0.010 μm or less and a Ry of 0.20 μm or less.

No particular limitation is imposed on the type of glass, and the glass may have the same characteristics (e.g., composition, glass transition point, softening point, and sag point) as described in relation to the first ceramic substrate for thin-film electronic components. No particular limitation is imposed on the shape, dimensions, and other properties of the glaze layer, and the same glaze layer as employed in the first ceramic substrate for thin-film electronic components may be employed without modification.

The glaze layer has a higher density as compared with a conventional glaze layer. By virtue of the high-density glaze layer, the aforementioned surface roughness can be attained. The term "dense or high density" means a state in which the top surface of the glaze layer (generally the top surface resulting from polishing) contains no pores.

Each of the first, second and third ceramic substrates for thin-film electronic components may have a base ceramic substrate, a glaze layer formed on at least one surface of the base ceramic substrate, and a wiring pattern formed inside the base ceramic substrate and the glaze layer.

In a preferred embodiment, at least one first end of the wiring pattern is exposed to the glaze layer surface of the ceramic substrate for thin-film electronic components, and at least one second end is exposed to the other surface of the ceramic substrate for thin-film electronic components.

As described above, at least one first end of the wiring pattern is exposed to the glaze layer surface of the ceramic substrate for thin-film electronic components, and at least one second end is exposed to the other surface of the ceramic substrate for thin-film electronic components. Specifically, when the ceramic substrate for thin-film electronic components has a glaze layer exclusively on one surface of the base ceramic substrate, the second end of the wiring pattern may be exposed to the back surface of the base ceramic substrate or to a side surface of the base ceramic substrate. When the ceramic substrate for thin-film electronic components has a glaze layer on each of front and back surfaces, the second end of the wiring pattern may be exposed to the back glaze layer surface. In other words, the wiring pattern may be formed so as to electrically connect the front surface to the back surface through the ceramic substrate for thin-film electronic components, or so as to electrically connect a surface having a glaze layer and a side surface of the ceramic substrate. Other features of the "interior wiring pattern" as employed in the first ceramic substrate for thin-film electronic components may also be employed.

[2] Thin-film Electronic Components

The thin-film electronic component of the present invention is characterized as containing the ceramic substrate of the present invention for a thin-film electronic component.

The aforementioned ceramic substrate of the present invention for thin-film electronic components may also be employed herein without modification. No particular limitation is imposed on the total thickness of the ceramic substrate for thin-film electronic components, and the total thickness is generally 200 to 2,000 μm (preferably 300 to 1,000 μm).

Examples of the thin-film electronic component of the present invention include thin-film capacitors and electronic component units having a thin-film capacitor.

In a preferred embodiment, the thin-film electronic component of the present invention has a capacitor portion composed of capacitor conductive layers and a capacitor dielectric layer which are stacked on the ceramic substrate for thin-film electronic components, wherein the capacitor portion is formed by alternatingly stacking the capacitor conductive layers and the capacitor dielectric layer such that the capacitor dielectric layer is disposed between two of the capacitor conductor layers opposing each other.

The thin-film electronic component of the present invention may be a thin-film capacitor or an electronic component unit having a thin-film capacitor.

Figure 14:
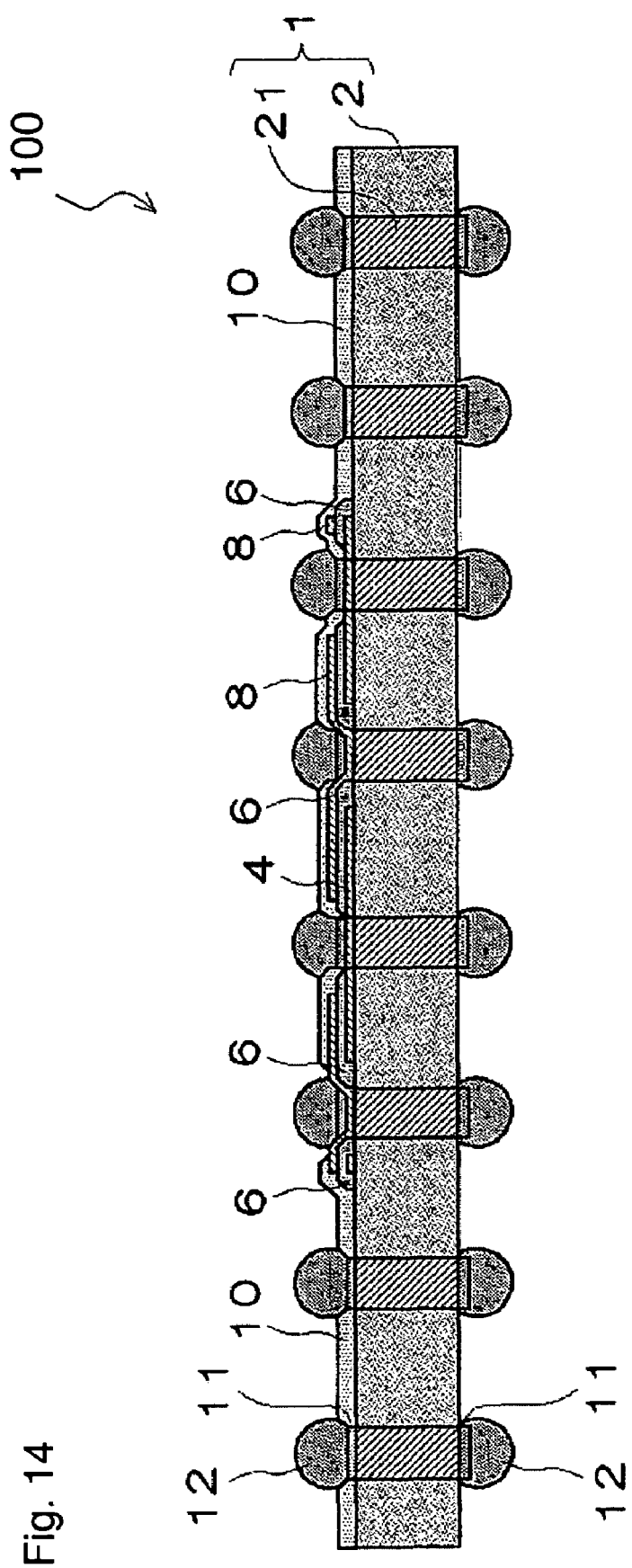
FIG. 14 is a schematic cross section of a thin-film electronic component (thin-film capacitor) of the present invention.

The aforementioned capacitor portion is composed of capacitor conductive layers and a capacitor dielectric layer which are stacked on the ceramic substrate for thin-film electronic components, wherein the capacitor portion is formed by alternatingly stacking the capacitor conductive layers and the capacitor dielectric layer such that the capacitor dielectric layer is disposed between two of the capacitor conductor layers opposing each other (see FIG. 14).

The aforementioned "capacitor conductor layer" is a conductor layer serving as one member of the capacitor portion. The capacitor conductor layer is a conductive thin film, and two conductive layers oppose each other via the below-mentioned capacitor dielectric layer. Each layer may be composed of one single layer or two or more layers. Generally, the lowermost layer and the uppermost layer of the stacked body formed from capacitor conductor layers and capacitor dielectric layers are composed of a capacitor conductor layer. No particularly limitation is imposed on the material for forming the capacitor conductor layer, so long as the material is electrically conductive (e.g., a resistivity of 10 μΩ·cm or less). Examples of the material include platinum, gold, copper, silver, nickel, titanium, molybdenum, chromium, cobalt, and tungsten. These materials may be used singly or in combination of two or more species. No particular limitation is imposed on the shape, dimension, and thickness of the capacitor conductor layer. The thickness is generally 1 μm or less. Preferably, these capacitor conductor layer materials, thickness of the capacitor conductor layer, or other conditions are appropriately selected in accordance with desired resistance values, productivity, production cost, etc.

The aforementioned "capacitor dielectric layer" is a portion which is one member of the capacitor portion and which provides interlayer insulation between the capacitor conductor layers. No particularly limitation is imposed on the material for forming the capacitor dielectric layer, so long as the material is an insulator (e.g., a resistivity of $10^{10}$ Ω·m or more). Examples of the material include titanates (e.g., barium titanate, strontium titanate, and lead titanate), tantalum oxide, and titanium oxide. These materials may be used singly or in combination of two or more species. When two or more species are used, the species may be used in the form of a mixture or solid solution.

No particular limitation is imposed on the shape, dimension, and thickness of the capacitor dielectric layer. The thickness is generally 1 μm or less. Preferably, these capacitor dielectric layer materials, thickness of the capacitor dielectric layer, or other conditions are appropriately selected in accordance with electric properties such as desired capacitance, insulation performance, and breakdown voltage; productivity; production cost; etc.

When the aforementioned thin-film electronic component of the present invention is fabricated, no particular limitation is imposed on the method for forming the capacitor conductor layer, and the layer may be formed using a thin film formation technique such as a sputtering method, a CVD method, or a CSD (Chemical Solution Deposition) method. If necessary, the conductor layer thus formed is patterned by etching or using a similar technique, thereby providing a capacitor conductor layer. Etching or a similar process may be performed through a known photolithographic technique.

No particular imitation is imposed on the method for forming the capacitor dielectric layer, and the CSD method may be employed. Specifically, a dielectric material containing a metal element for forming a target capacitor dielectric layer is applied to a substrate, and the applied material is heated, to thereby obtain a capacitor dielectric layer. No particular limitation is imposed on the dielectric material employed in the CSD method, and an organometallic compound containing a metal element for forming a target capacitor dielectric layer is preferred. Examples of useful organometallic compounds include alkoxides, acetate compounds, and oxalate compounds. Examples of the aforementioned alkoxides include titanium alkoxide such as titanium isopropoxide; barium alkoxides obtained by dissolving metallic barium in an alcoholic organic solvent; and strontium alkoxides such as strontium n-butoxide. Before use, these alkoxides may be polymerized by adding a predetermined amount of pure water thereto. Examples of the alcoholic organic solvent include an ethanol-acetlyacetone mixture, 2-ethoxyethanol, and an alcoholic organic solvent containing a chemical species which can form a chelate with a target metallic species.

Before application, the aforementioned dielectric material may be homogenized through heating or a similar means. No particular limitation is imposed on the method for applying the dielectric material, and the paste may be applied by spin coating, dip coating, spraying (ink-jet, thermal, etc.) or other methods. If necessary, the dielectric layer thus formed is patterned by etching or a similar technique, thereby providing a capacitor dielectric layer.

[3] Method for Producing a Ceramic Substrate for Thin-film Electronic Components No particular limitation is imposed on the method for producing the first to third ceramic substrates for thin-film electronic components, when the substrates have an interior wiring pattern. These ceramic substrates can be produced through the first or second production method of the present invention. Since the ceramic substrate of the present invention for thin-film electronic components has a base ceramic substrate made of ceramic material, a substrate having an interior wiring pattern can be readily produced by stacking component layers to form an unfired body, patterning the layers and forming wiring, etc., and then firing. Therefore, use of the base ceramic substrate is remarkably advantageous as compared with a glass substrate or a single crystal substrate. However, similar to other ceramic layers, the aforementioned glaze layer is difficult to pattern in an unfired stage. Thus, a particularly elaborate technique is required. The method of the present invention for producing a ceramic substrate for thin-film electronic components will next be described.

The first method of the present invention for producing a ceramic substrate for thin-film electronic components is characterized in that the method comprises the following steps in the order given: a resist layer forming step, a patterning step, an interior wiring pattern end portion forming step, a resist layer removing step, a glass layer forming step, a heating-and-pressurizing step, and a planarization-polishing step.

The aforementioned "resist layer forming step" includes forming a resist layer on a surface of a base ceramic substrate having an interior wiring pattern having an end surface that is exposed to the surface of the substrate. The resist layer prevents formation of a conductor during the below-mentioned interior wiring pattern end portion forming step. No particular limitation is imposed on the type of resist material, but a photoresist is preferred from the viewpoint of easiness of removal.

The aforementioned "patterning step" includes patterning the resist layer formed in the resist layer forming step, thereby forming a patterning hole in communication with the end surface of the interior wiring pattern. The patterning may be performed by various means, and generally through a photolithographic means. For example, the patterning may be performed through the following steps: disposing a mask on a surface of the resist layer; exposing a portion to be removed after the patterning step; and removing the uncured unnecessary portion.

The aforementioned "interior wiring pattern end portion forming step" includes forming an end portion of the interior wiring pattern, the end portion being connected with the end surface of the interior wiring pattern, by filling the patterning hole with an electroconductive material. No particular limitation is imposed on the method for forming the end portion of the interior wiring pattern (hereinafter also referred to as a "pattern end portion"), and the end portion may be formed by electroplating or electroless plating. When one end portion is exposed to a surface of the base ceramic substrate and another end portion is exposed to another portion of the base ceramic substrate, both end portions of the interior wiring pattern may be electroplated. When the base substrate contains a plurality of interior wiring patterns, a pattern end portion may be formed in a single step through short-circuiting of these wiring patterns. When the other end of the interior wiring pattern is not exposed to a surface of the base ceramic substrate or in a similar case, a pattern end portion may be formed by electroless plating.

The aforementioned "resist layer removing step" includes removing the patterned resist layer. As mentioned above, the resist layer is required for forming a pattern end portion, and the resist layer may be removed after formation of the pattern end portion has been completed. No particular limitation is imposed on the means for removing the resist, and when the aforementioned photoresist is employed, the resist may be removed by use of a predetermined remover liquid.

The aforementioned "glass layer forming step" includes forming a glass layer on a surface of the base ceramic substrate such that at least a portion of the pattern end portion is buried with the glass layer. Through removal of a portion of the resist layer performed in the aforementioned resist layer removing step, a pattern end portion formed in a patterning hole present in the resist layer protrudes from a surface of the base ceramic substrate. Then, a glass layer is formed, for example, by applying a glass paste to the substrate such that at least a portion of the protruding pattern end portion is buried with the glass paste, and baking the glass paste. The entirety of the pattern end portion may be buried in the glass layer, or only a portion of the pattern end portion may be buried in the glass layer. In the present step, the same method for forming the glass layer as described in relation to the aforementioned third ceramic substrate for thin-film electronic components may be applied without modification.

The aforementioned "heating-and-pressurizing step" includes performing heating-and-pressurizing treatment, thereby forming a glaze layer on a surface of the base ceramic substrate. In the present step, the same heating-and-pressurizing method as described with respect to the aforementioned third ceramic substrate for thin-film electronic components may be applied without modification.

The aforementioned "planarization-polishing step" includes polishing a surface of the glaze layer which has been formed in the heating- and pressurizing step to provide a flat surface, thereby exposing the pattern end portion. As mentioned above, when the pattern end portion has not been completely buried in the glass layer forming step, the pattern end portion remains exposed prior to the planarization-polishing step. Thus, the pattern end portion also remains exposed after completing the planarization-polishing step. In the present step, the same planarization-polishing method as described with respect to the aforementioned third ceramic substrate for thin-film electronic components may be applied without modification.

The second method of the present invention for producing a ceramic substrate for thin-film electronic components is characterized in that the method comprises the following steps in the order given: a glass layer forming step, a heating-and-pressurizing step, a resist layer forming step, a patterning step, an etching step, a resist layer removing step, and a planarization-polishing step.

The aforementioned "glass layer forming step" includes forming a glass layer on a surface of a base ceramic substrate having an interior wiring pattern whose end surface is exposed to the surface of the substrate. The same glass layer forming step as employed in the first production method may also be employed, without modification, as the present step. In this case, however, the pattern end portion is not provided on a surface (to which a glass paste is applied) of the base ceramic substrate.

The aforementioned "heating-and-pressurizing step" includes performing heating-and-pressurizing treatment, thereby forming a glaze layer on a surface of the base ceramic substrate. The same heating-and-pressurizing step as employed in the first production method may also be employed, without modification, as the present step. In this case, however, the glass layer which undergoes heating-and-pressurizing treatment has no pattern end portion.

The "resist layer forming step" includes forming a resist layer on a surface of the glaze layer. The same resist layer forming step as employed in the first production method may also be employed, without modification, as the present step. In this case, however, an end portion of the interior wiring pattern is not exposed to the surface on which the resist layer is formed.

The aforementioned "patterning step" includes patterning the resist layer, thereby forming a patterning hole in communication with the end surface of the interior wiring pattern. The expression "in communication with the end surface of the interior wiring pattern" means that the patterning hole, by means of the below-mentioned etching step, communicates via an etching hole with the end portion of the interior wiring pattern exposed to a surface of the base ceramic substrate. The same patterning step as employed in the first production method may also be employed, without modification, as the present step. In this case, however, a patterning hole formed through the patterning step is not in direct contact with the end portion of the interior wiring pattern.

The aforementioned "etching step" includes etching the glaze layer through the patterning hole, thereby forming an etching hole connecting with the end surface of the interior wiring pattern. No particular limitation is imposed on the type of etching agent, the etching conditions, etc., and preferably, these are appropriately selected in accordance with the glass which forms the glaze layer. For example, the glaze layer may be etched using a hydrofluoric-acid-based etching agent.

The aforementioned "resist layer removing step" includes removing the patterned resist layer, and the "interior wiring pattern end portion forming step" includes forming an end portion of the interior wiring pattern, the end portion being connected with the end surface of the interior wiring pattern, by filling the etching hole with an electroconductive material.

The aforementioned "planarization-polishing step" includes polishing a surface of the glaze layer to provide a flat surface, thereby exposing the end portion of the interior wiring pattern. The same "planarization-polishing step" as mentioned with respect to the first production method may also be employed, without modification, as the present step. In this case, however, the pattern end portion remains exposed to a surface of the glaze layer prior to the planarization-polishing step.

EXAMPLES

The present invention will next be described in detail by way of examples and in reference to the drawings. However, the present invention should not be construed as being limited thereto.

[1] Production of Ceramic Substrate for Thin-film Electronic Components (the Substrate Containing No Interior Wiring Pattern)

(1) Production of Base Ceramic Substrate

Figure 6:
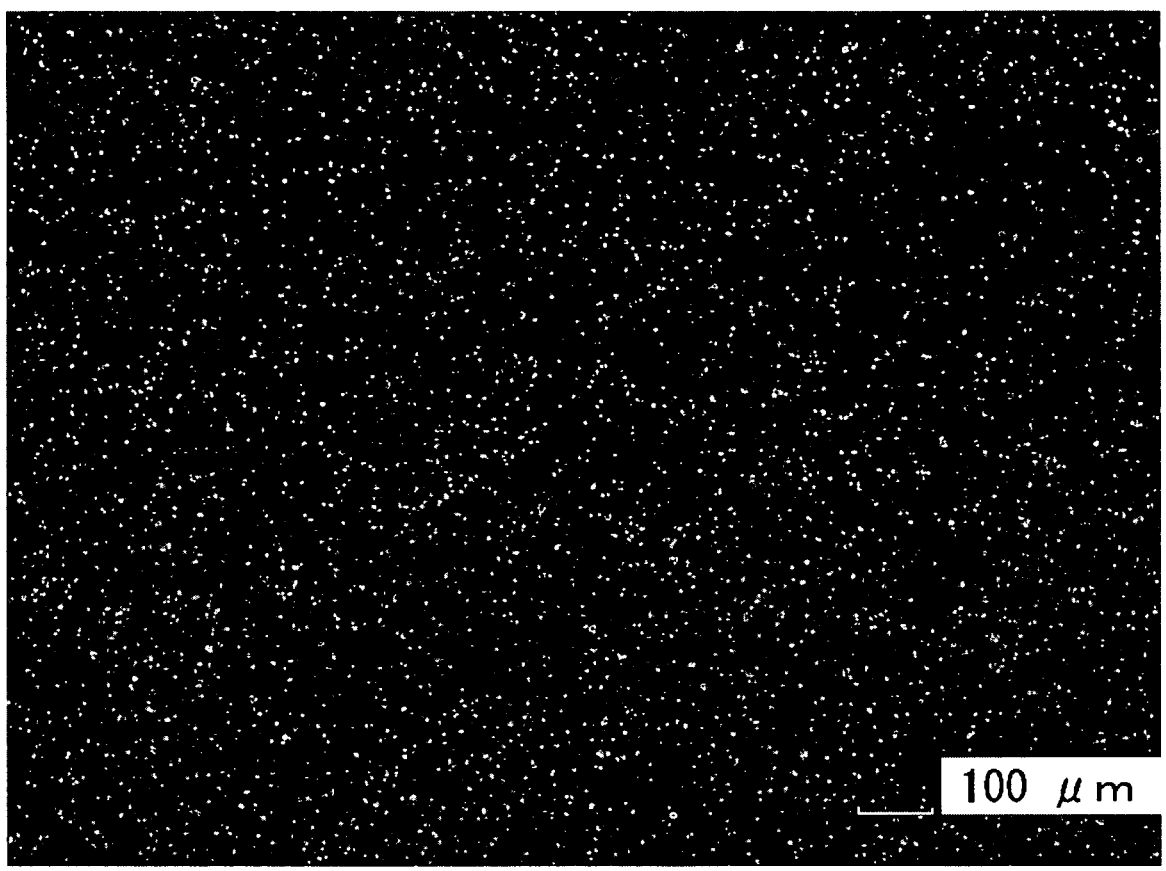
FIG. 6 shows a surface of a base ceramic substrate which had not undergone planarization-polishing (×200).
Figure 7:
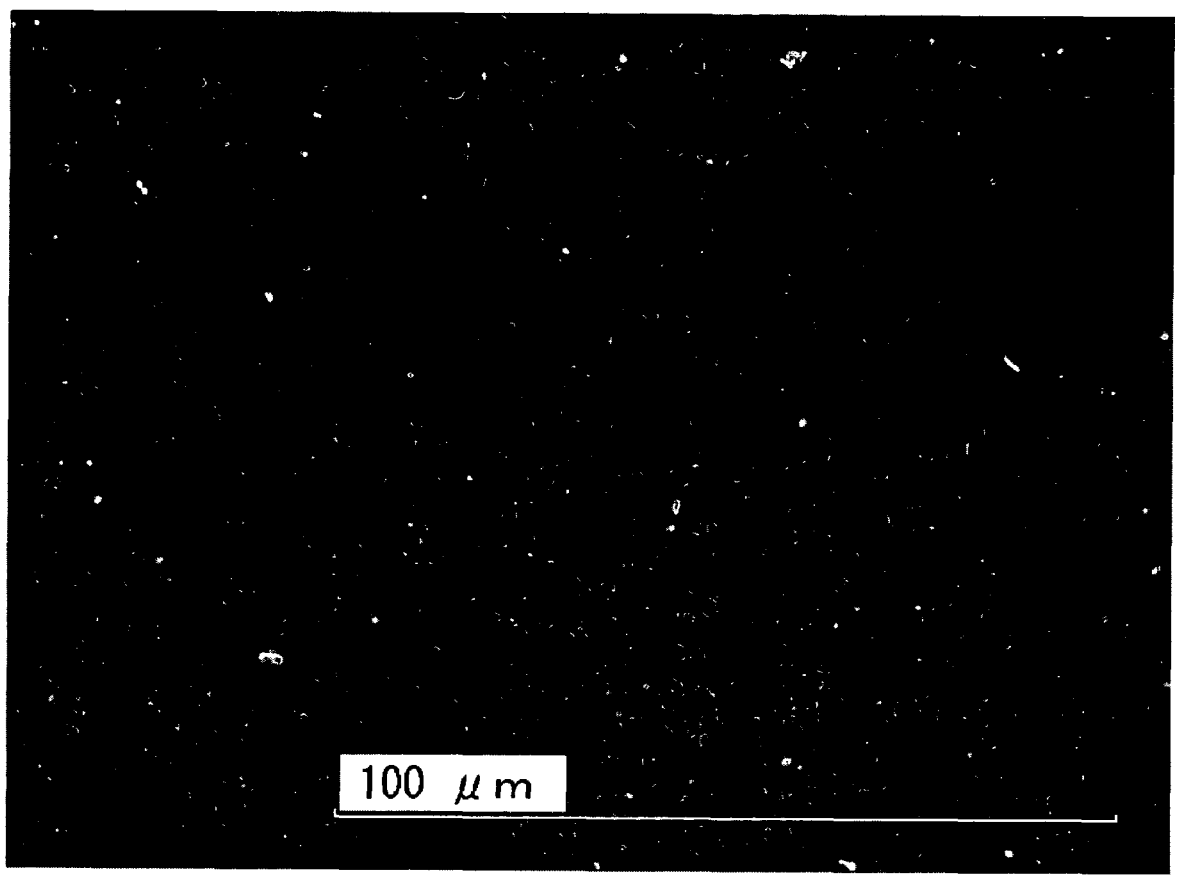
FIG. 7 shows the surface of a base ceramic substrate which had not undergone planarization-polishing (×2,000).

An alumina powder ($Al_2O_3$ purity: 90% or higher) (90 to 95 mass %) having a mean particle size of 3 to 5 μm and a flux powder (sintering aid) (5 to 10 mass %) predominantly containing $Al_2O_3$, $SiO_2$, and CaO were mixed together, to thereby prepare a powder mixture (100 mass %). A slurry prepared from the powder mixture was formed into a sheet having a thickness of 200 μm through the doctor blade method, and the sheet was cut to pieces of desired dimensions, to thereby prepare green sheets. Three of the green sheets were laminated on one another to thereby prepare a green base ceramic sheet having a thickness of 600 μm. The green base ceramic sheet was fired to thereby prepare a base ceramic substrate. The surface roughness of each base ceramic substrate was measured by means of a stylus surface texture measuring instrument (product of Tokyo Seimitsu Co., Ltd., Model SURFCOM 1400D). Ra and Ry were found to be 0.24 μm and 5.7 μm, respectively. FIGS. 6 and 7 show the surface of the base ceramic substrate, which had undergone no planarization polishing (magnitude: ×200 and ×2,000, respectively).

Figure 8:
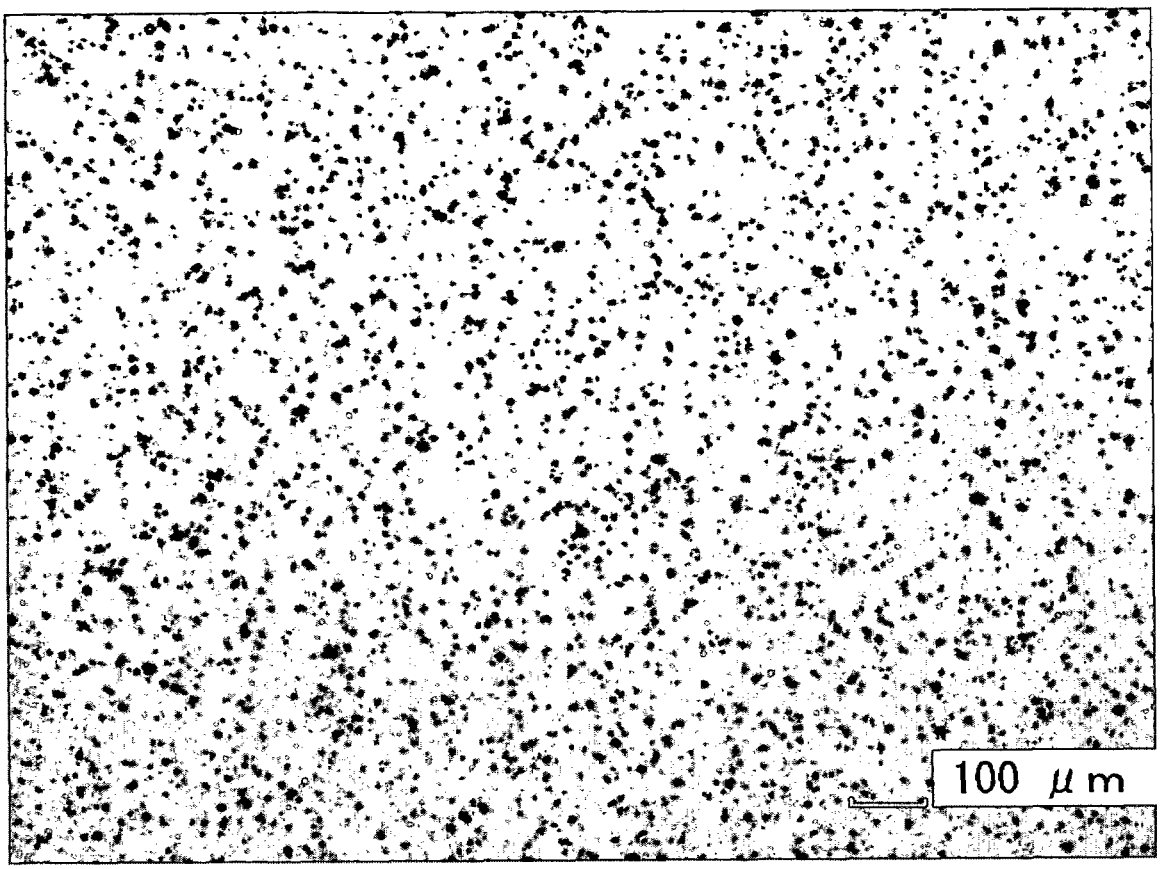
FIG. 8 shows the surface of a base ceramic substrate which had undergone planarization-polishing (×200).
Figure 9:
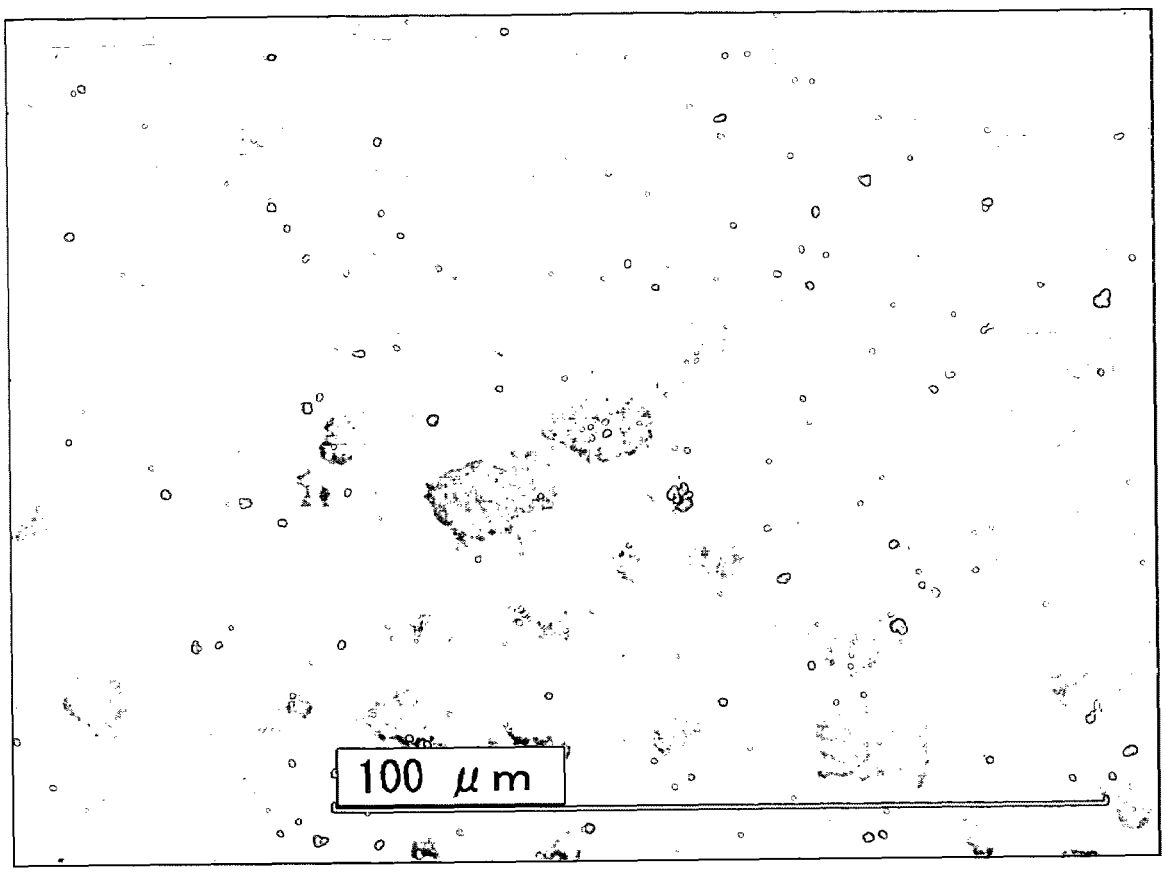
FIG. 9 shows the surface of a base ceramic substrate which had undergone planarization-polishing (×2,000).

Subsequently, the base ceramic substrate was polished so as to obtain a flat surface. The surface roughness of the polished base ceramic substrate was measured as described above. Ra and Ry were found to be 0.078 μm and 0.97 μm, respectively. FIGS. 8 and 9 show the surface of the polished base ceramic substrate (magnitude: ×200 and ×2,000, respectively).

(2) Formation of Glaze Layer

An acrylic resin (binder) was dissolved in terpineol (solvent), and a glass powder was mixed with the solution, to thereby prepare a glass paste. The glass powder used to prepare the paste contained Si, B, Al, and Ca in amounts (as reduced to $SiO_2$, $B_2O_3$, $Al_2O_3$, and CaO, respectively) of 55 to 65 mol %, 15 to 25 mol %, 5 to 15 mol %, and 5 to 15 mol %, respectively (total amount: 100 mol %), and had a mean particle size of about 3 μm. The glass paste was applied to the base ceramic substrate through screen printing, and the product was dried and then baked at 1,000° C. in the atmosphere.

Figure 10:
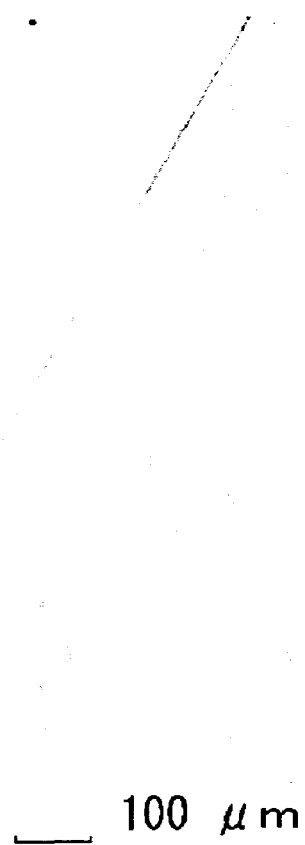
FIG. 10 shows the surface of a glass layer which had undergone planarization-polishing (×200).
Figure 11:
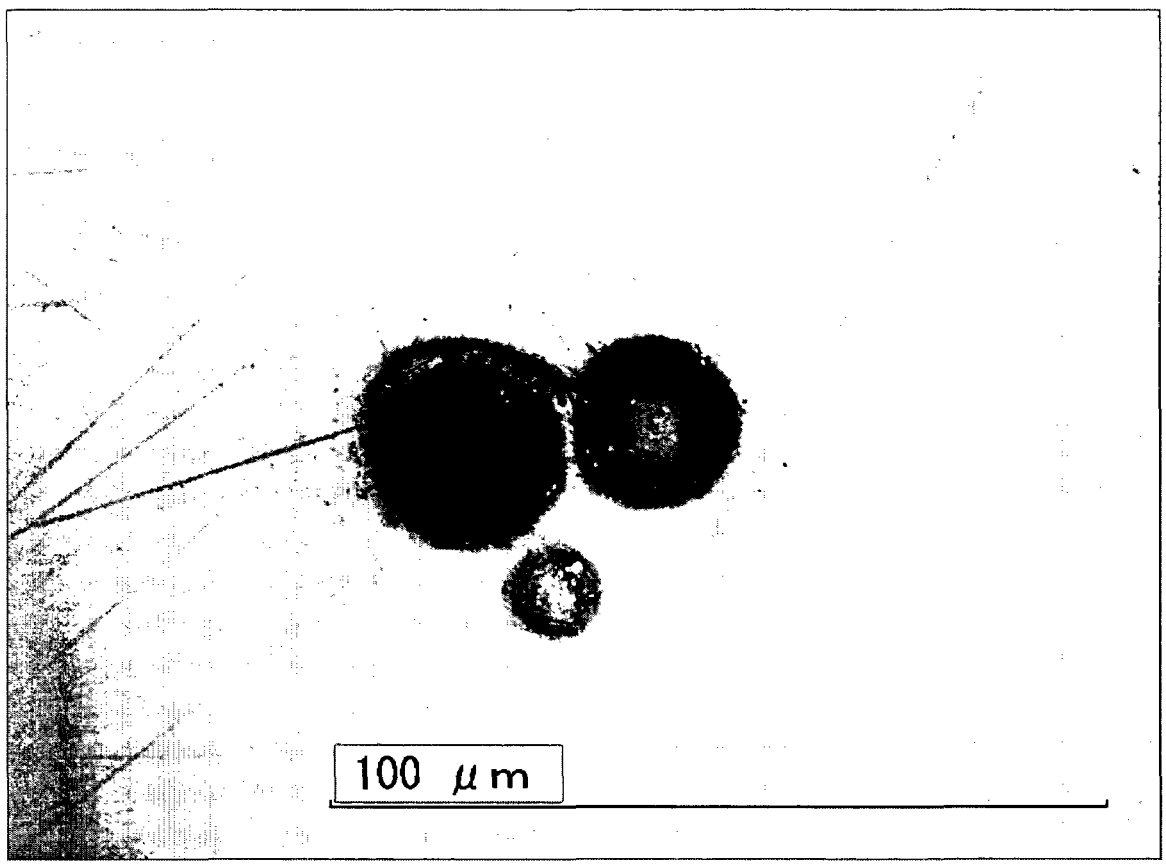
FIG. 11 shows the surface of a glass layer which had undergone planarization-polishing (×2,000).

The thus-formed glass layer was then polished for evaluation (but, generally, this polishing step is not required), and the surface roughness of the layer was determined in a similar manner. Ra and Ry were found to be 0.60 µm and 13.0 µm, respectively. FIGS. 10 and 11 show the surface of the glass layer (magnitude: ×200 and ×2,000, respectively).

Thereafter, the base ceramic substrate having the glass layer formed thereon was placed in a HIP furnace, and the furnace interior temperature was elevated to 800° C. without pressurizing, to thereby sufficiently soften the glass layer. Subsequently, while the substrate was pressurized at 5 MPa under nitrogen, the furnace interior temperature was elevated from 800° C. to 950° C. Under these conditions, the substrate was subjected to heating-and-pressurizing treatment for 15 minutes.

Subsequently, the thus-treated base ceramic substrate having a glaze layer formed thereon was removed from the HIP furnace, and then subjected to planarization polishing. The planarization polishing was performed through mechanical polishing by use of a diamond paste. A plurality of diamond pastes having different diamond abrasive grain sizes were provided, and these pastes were sequentially used in such a way that the grain size was gradually decreased. The diamond paste employed in the final polishing stage had a mean grain size of 2 µm or less.

Figure 12:
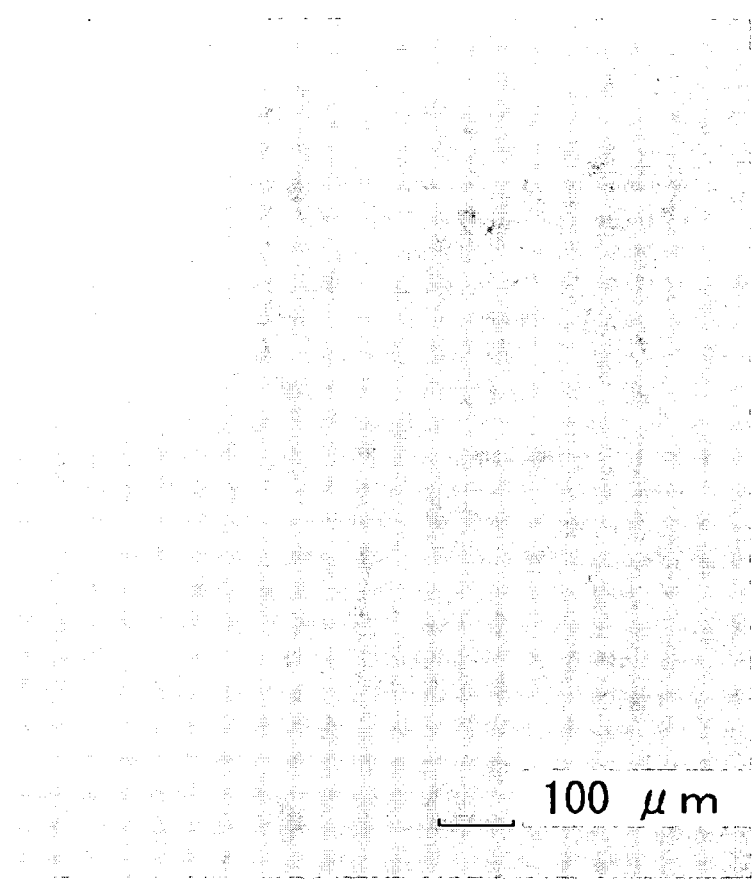
FIG. 12 shows the surface of a glaze layer which had undergone planarization-polishing (×200).
Figure 13:
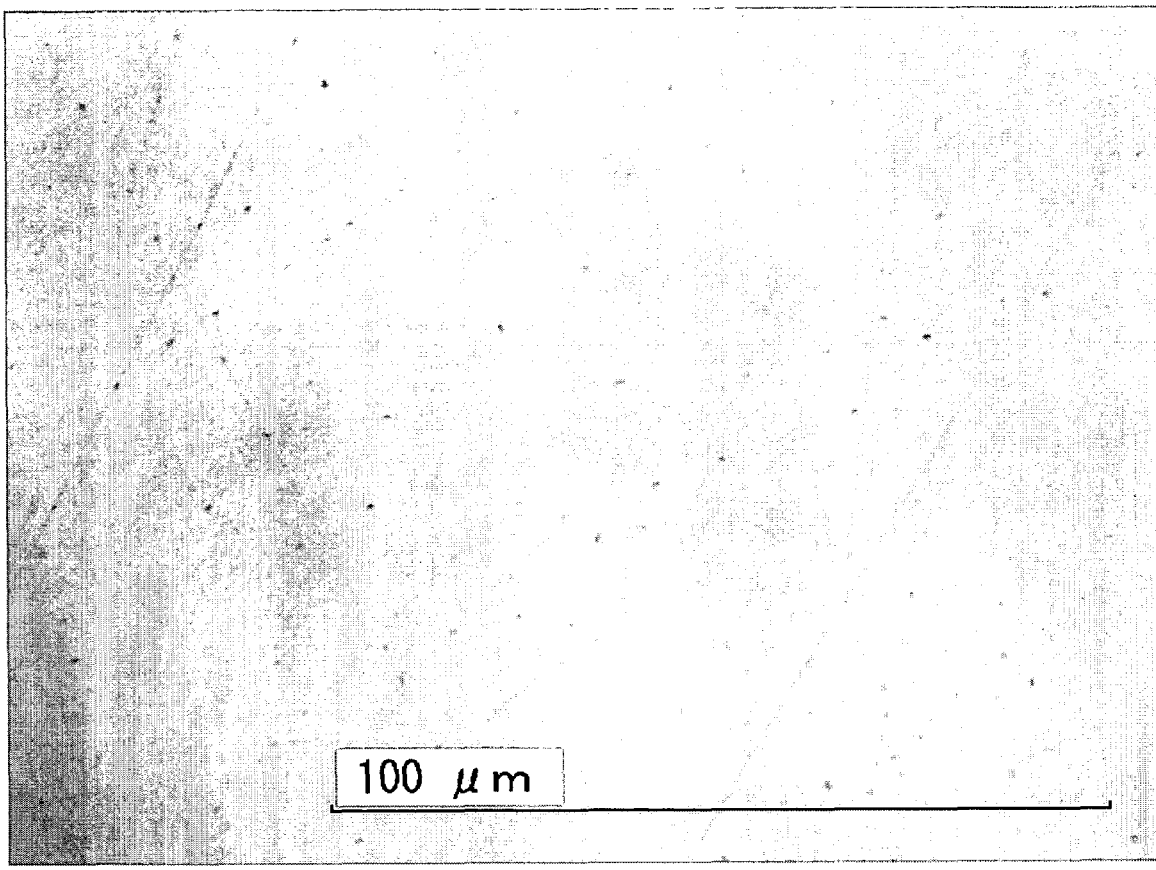
FIG. 13 shows the surface of a glaze layer which had undergone planarization-polishing (×2,000).

The surface roughness of the glaze layer which had undergone planarization polishing was measured through use of the above-described stylus surface texture measuring instrument. Ra and Ry were found to be 0.0079 µm and 0.18 µm, respectively. FIGS. 12 and 13 show the surface of the glaze layer which had undergone planarization polishing (magnitude: ×200 and ×2,000, respectively).

(3) Evaluations

The surface of the base ceramic substrate was found to have relatively large values of Ra and Ry (0.24 µm and 5.7 µm, respectively). Even when the base ceramic substrate was polished, the surface roughness was not remarkably improved; i.e., Ra and Ry were found to be 0.078 µm and 0.97 µm, respectively. As is clear from FIGS. 6 to 9, pores present in the surface of the base ceramic substrate prevent an improvement in surface roughness. The planarization-polished surface of the glass layer which had undergone no heating-and-pressurizing treatment was found to have surface roughness parameters Ra and Ry of 0.6 µm and 13.0 µm, respectively. That is, the surface roughness of the planarization-polished glass layer was worsened, as compared with the polished surface of the base ceramic substrate. As is shown in FIGS. 10 and 11, the number of pores is considerably reduced by forming of the glass layer. However, pores appearing in FIG. 10 are larger than those appearing in FIG. 8. That is, these large pores prevent improvement in surface roughness.

In contrast, the surface of the product according to the present invention, which had undergone heating-and-pressurizing treatment and planarization polishing, was found to have Ra and Ry of 0.0079 µm and 0.18 µm, respectively. That is, both Ra and Ry of the surface of the product of the present invention were reduced, by as much as 97%, as compared with the non-treated base ceramic substrate. Also, Ra and Ry of the surface of the product of the present invention were reduced, by as much as 90% and 81%, respectively, even as compared with those of the planarization-polished surface of the base ceramic substrate. Moreover, both Ra and Ry of the surface of the product of the present invention were reduced, by as much as 99%, as compared with those of the planarization-polished surface of the glaze layer, which had undergone no heating-and-pressurizing treatment. As shown in FIGS. 12 and 13, no pores were formed in the surface of the product of the present invention.

These results indicate that, according to the present invention, even when a general ceramic substrate having many pores is used, the surface roughness parameters of the substrate can be reduced by at least 81%.

Figure 2:
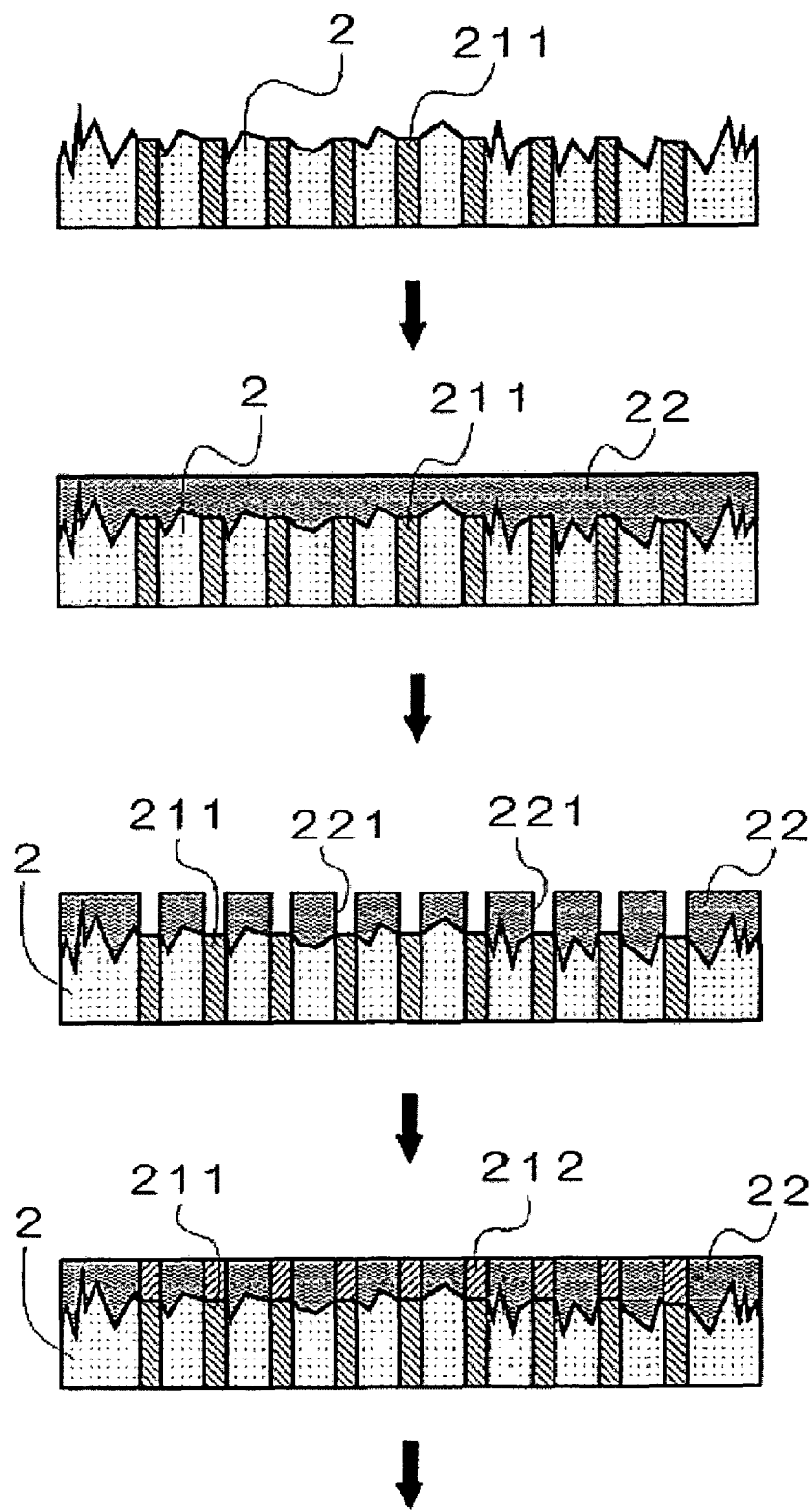
FIG. 2 schematically shows one exemplary process for producing the ceramic substrate of the present invention for thin-film electronic components.
Figure 3:
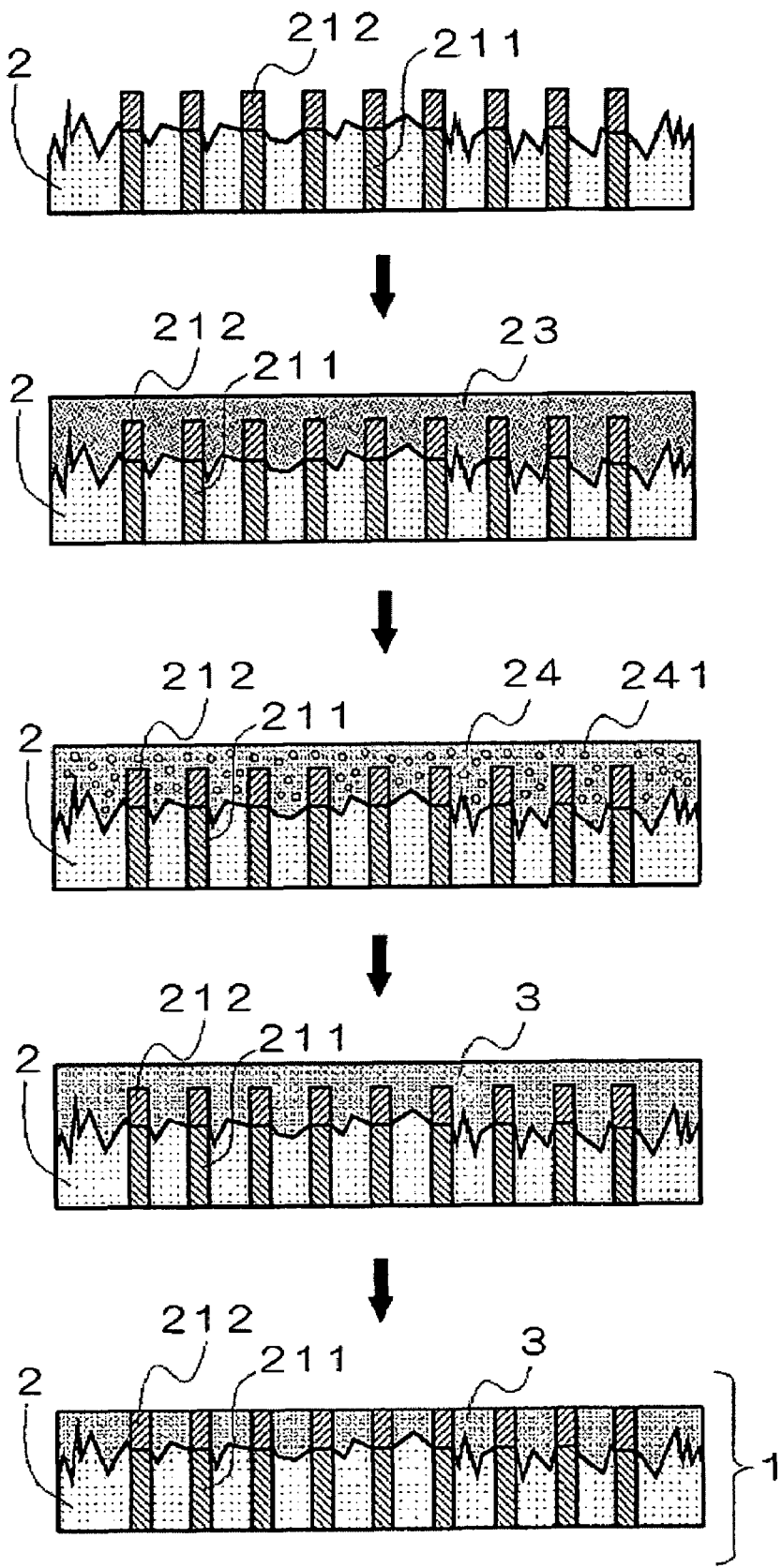
FIG. 3 schematically shows one exemplary process for producing the ceramic substrate of the present invention for thin-film electronic components.

[2] Production 1 of Ceramic Substrate for Thin-film Electronic Components, the Substrate Containing Wiring Pattern Production of a ceramic substrate (1) for thin-film electronic components, the substrate containing a wiring pattern (21), will next be described with reference to FIGS. 2 and 3. Steps shown in FIG. 2 are followed by steps shown in FIG. 3.

(1) Production of Base Ceramic Substrate (2)

In a manner similar to that of [1] (1) above, a green base ceramic sheet having a thickness of 600 µm was prepared. Via holes having a diameter of 120 µm (post-firing diameter firing of 100 µm) were formed in the green base ceramic sheet by means of a $CO_2$ laser. Subsequently, the via holes were filled, through printing, with a conductive material predominantly containing tungsten powder, ethyl cellulose (binder), and butyl carbitol (solvent) (which material forms an interior wiring pattern through firing). Thereafter, the green product was cut into pieces of desired dimensions, and each piece was fired, to thereby produce a base ceramic substrates (2) having an interior wiring pattern (211) extending therethrough between opposing surfaces.

(2) Resist Layer Forming Step and Patterning Step

A photosensitive resist was applied, by spin coating, to a surface of the base ceramic substrate (2) obtained in (1) above, to thereby form a photoresist layer (22) having a thickness of 50 µm. Subsequently, a photomask having the corresponding inverted pattern with respect to the interior wiring pattern (211) formed in the base ceramic substrate (2) was placed on the photoresist layer (22), and the layer was irradiated with an UV ray. Thereafter, uncured portions were removed by use of a developer, whereby patterning holes (221) were formed. At the bottom of patterning holes (221), the interior wiring pattern was exposed.

(3) Interior Wiring Pattern End Portion Forming Step and Resist Layer Removing Step The interior wiring pattern (211) exposed to the bottom surface of the base ceramic substrate (2) was completely short-circuited, and the substrate was immersed in an electrolytic plating bath. Cupper was deposited in the patterning holes (221) formed in (2) above, whereby a pattern end portion (212) having a thickness of approximately 50 µm (as thick as the photoresist layer) was formed. Thereafter, the remaining photoresist layer (22) was completely removed by use of a solvent. Through this removing step, the pattern end portion (212), formed in the interior wiring pattern end portion forming step, protrudes from the surface of the base ceramic substrate (2).

(4) Glass Paste Applying Step, Heating-and-pressurizing Step, and Planarization Polishing Step A glass paste prepared in a manner similar to that of [1] (2) above was applied to the base ceramic substrate (2) and then dried in a similar manner, whereby a glass paste layer (23) having a thickness (dried state) of 250 µm was formed. Subsequently, the glass paste layer (23) was baked in a non-oxidizing atmosphere ($N_2$—$H_2$—$H_2O$) at 1,000° C. for glass formation, whereby a glass layer (24) including voids (241) and having a thickness of 100 µm was formed.

Thereafter, in a manner similar to that of [1] (2) above, HIP treatment was performed to thereby form a glaze layer (3). In a manner similar to that of [1] (2) above, planarization polishing was performed, to thereby produce the ceramic substrate (1) of the present invention for thin-film electronic components, the substrate containing the wiring pattern (21) and the glaze layer (3) having surface roughness parameters Ra and Ry of 0.01 μm or less and 0.2 μm or less, respectively.

Figure 4:
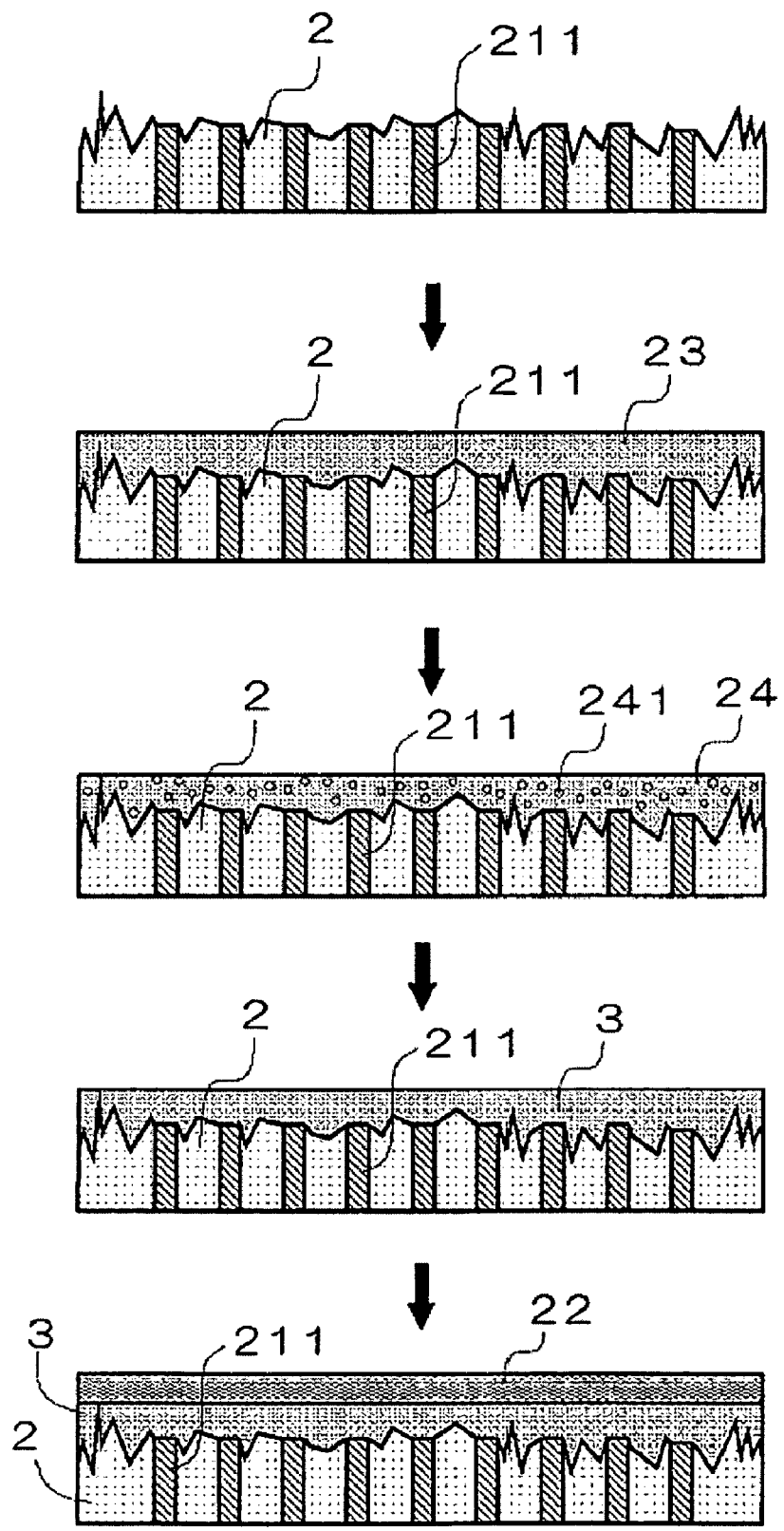
FIG. 4 schematically shows another exemplary process for producing the ceramic substrate of the present invention for thin-film electronic components.
Figure 5:
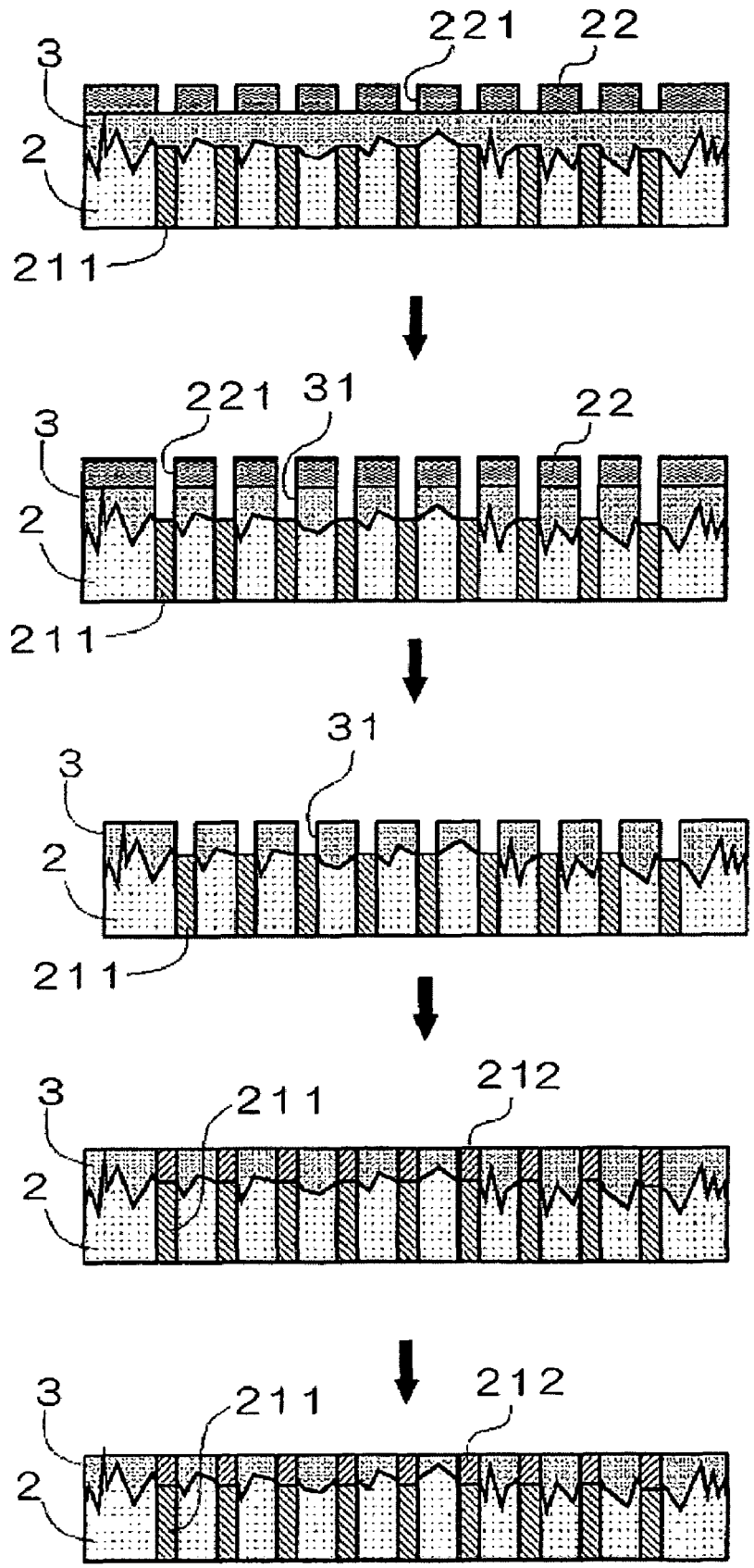
FIG. 5 schematically shows another exemplary process for producing the ceramic substrate of the present invention for thin-film electronic components.

[3] Production 2 of Ceramic Substrate for Thin-film Electronic Components, the Substrate Containing Wiring Pattern Production of a ceramic substrate for thin-film electronic components, the substrate containing a wiring pattern 21, will next be described with reference to FIGS. 4 and 5. Steps shown in FIG. 4 are followed by steps shown in FIG. 5.

(1) Production of Base Ceramic Substrate (2)

In a manner similar to that of [2] (1) above, a base ceramic substrate (2) containing an interior wiring pattern (211) extending therethrough between the opposing surfaces was prepared.

(2) Glass Layer Forming Step and Heating-and-pressurizing Step

A glass paste prepared in a manner similar to that of [1] (2) above was applied to the substrate and then dried in a similar manner, to thereby produce a glass paste layer (23) having a thickness (dried state) of 250 μm. Subsequently, the glass paste layer (23) was baked in a manner similar to that of [2] (4) above, whereby a glass layer (24) was formed. Thereafter, in a manner similar to that of [1] (2) above, HIP treatment was performed, whereby a glaze layer (3) was formed.

(3) Resist Layer Forming Step and Patterning Step

On a surface of the base ceramic substrate (2) produced in the above (2), a photoresist layer (22) was formed in a manner similar to that of [2] (2) above (the thickness of the photoresist layer was several microns). Patterning holes (221) were formed in the photoresist layer (22) in a similar manner. The glaze layer (3) was exposed at the bottom of patterning holes (221).

(4) Etching Step and Resist Layer Removing Step

Through patterning holes (221) formed in the above (3), glaze layer (3) was etched with hydrofluoric acid, to thereby form etching holes (31) extending through the glaze layer (3) between patterning holes (221) and the surface of base ceramic substrate (2). At the bottom of the etching holes (31), an end surface of the interior wiring pattern (211) was exposed. Subsequently, the remaining photoresist layer (22) was completely removed by washing with acetone.

(5) Interior Wiring Pattern End Portion Forming Step and Planarization Polishing Step The interior wiring pattern (211) exposed to the bottom surface of the base ceramic substrate (2) produced in the above (4) was completely short-circuited, and the substrate was immersed in an electrolytic plating bath. Copper was deposited in the etching holes (31) formed above, whereby an end pattern (212) was formed. Thereafter, planarization polishing was performed in a manner similar to that of [1] (2) above, to thereby produce the ceramic substrate (1) of the present invention for thin-film electronic components, the substrate containing the wiring pattern (21) and the glaze layer (3) having surface roughness parameters Ra and Ry of 0.01 μm or less and 0.2 μm or less, respectively.

[4] Production of Thin-film Electronic Components (Production of Thin-film Capacitor)

Figure 15:
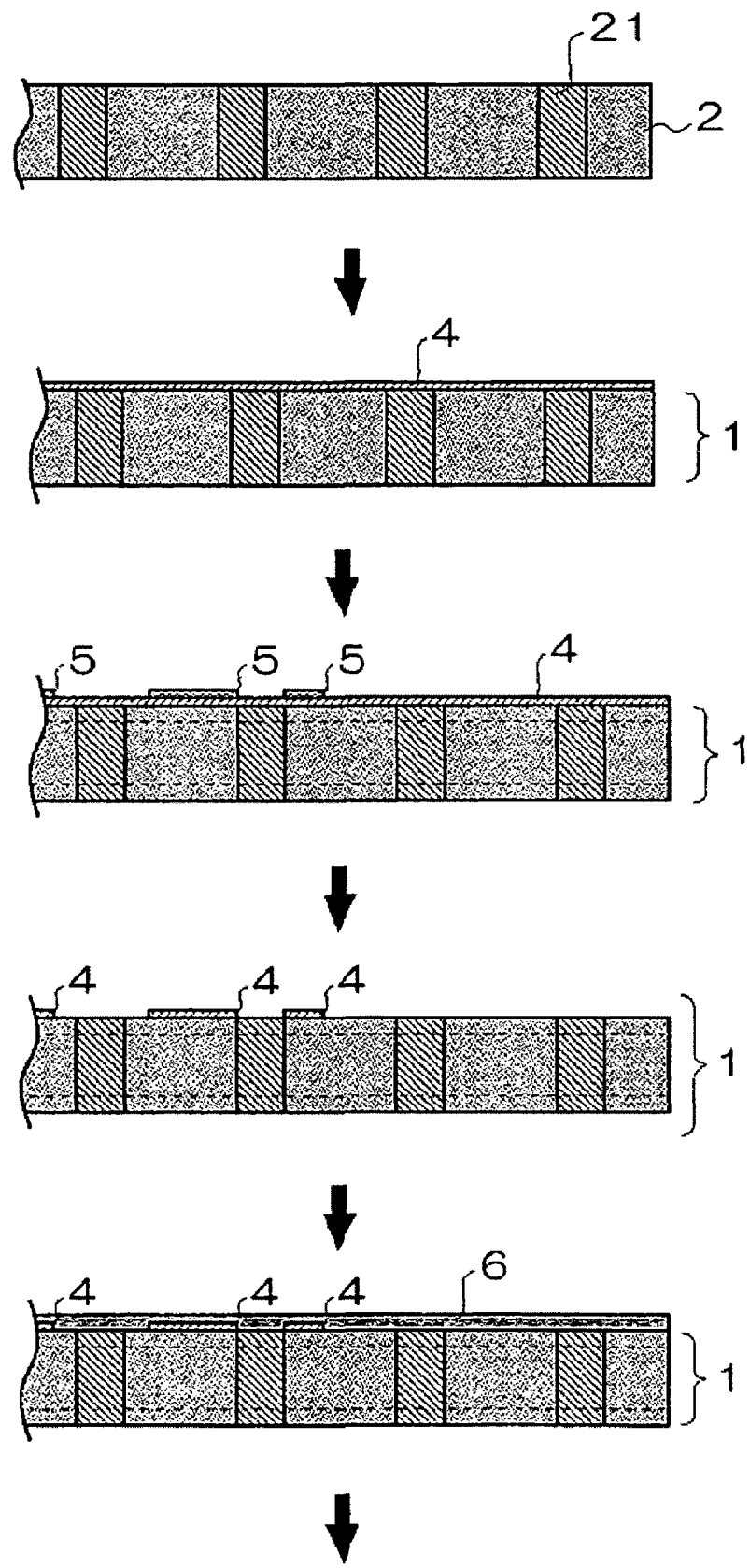
FIG. 15 schematically shows a process for producing a thin-film capacitor of the present invention.
Figure 16:
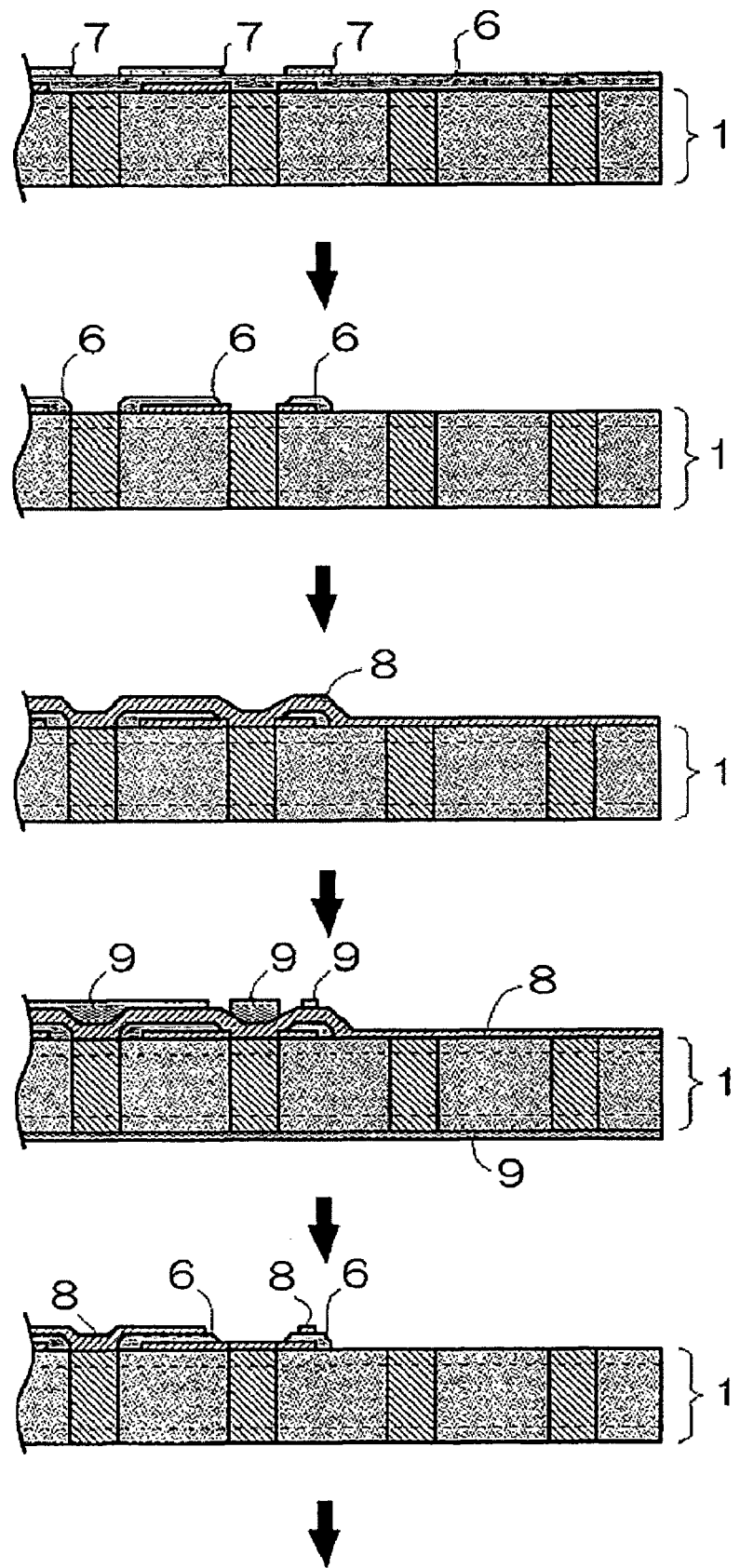
FIG. 16 schematically shows a process for producing a thin-film capacitor of the present invention.
Figure 17:
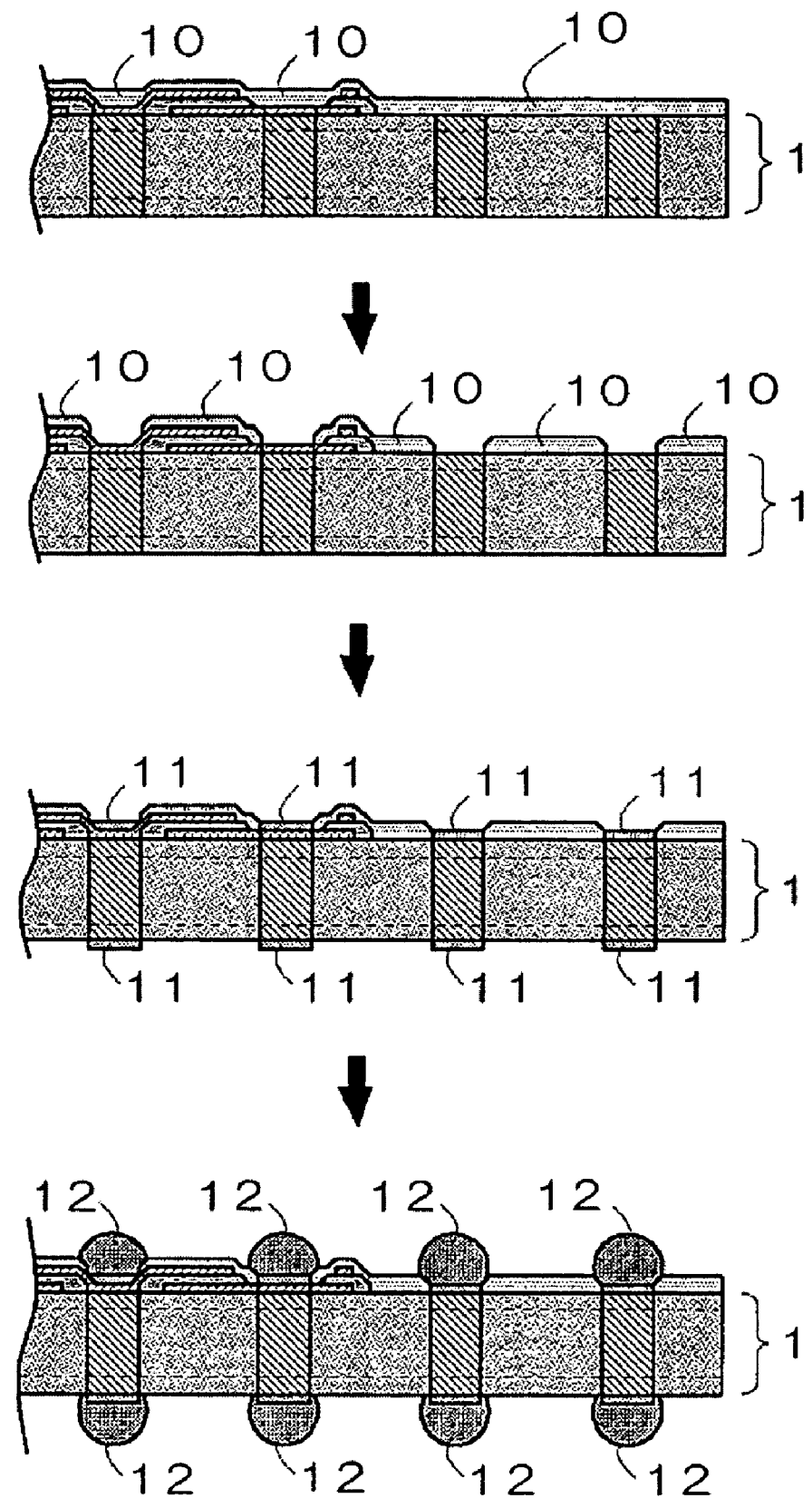
FIG. 17 schematically shows a process for producing a thin-film capacitor of the present invention.

Production of a thin-film capacitor (100) will next be described with reference to FIGS. 14 to 17. FIGS. 15 to 17 show right half portions of the thin-film capacitor (100) of FIG. 14. For the sake of convenience, the same reference numerals as employed before firing are also employed for the same structural elements after firing. Steps of (1-a) to (1-d), steps of (1-e) to (1-i), and steps of (1-j) to (1-m) will be described below with reference to FIGS. 15, 16, and 17, respectively.

(1-a) To a surface of the ceramic substrate (1) for thin-film electronic components produced in the above [2], a capacitor conductor layer (4) formed of platinum and having a thickness of 0.2 μm was formed through sputtering. The capacitor conductor layer (4) will basically serve as the lower electrode of the capacitor.

(1-b) Subsequently, in order to pattern the capacitor conductor layer (4), portions of the capacitor conductor layer surface which were not to be etched were covered by an etching resist (5).

(1-c) Thereafter, etching was performed by ion milling to thereby pattern the capacitor conductor layer (4), and the etching resist (5) was removed.

(1-d) Subsequently, titanium isopropoxide, strontium n-butoxide, and metallic barium were dissolved in 2-ethoxyethanol, to thereby prepare a starting dielectric material (6), and the starting material was applied, through spin coating, to a surface of the substrate having the capacitor conductor layer (4) formed thereon through patterning. Thereafter, the applied starting dielectric material (6) was dried and then heated at 700° C., to thereby produce a capacitor dielectric layer (6) having a thickness of 0.2 μm.

(1-e) In order to pattern the capacitor dielectric layer (6), portions of the capacitor conductor layer surface which were not to be etched were covered by etching resists (7).

(1-f) Thereafter, the capacitor dielectric layer (6) was etched with buffered hydrofluoric acid, to thereby pattern the capacitor dielectric layer (6) and then remove the resists (7).

(1-g) Subsequently, on the surface of the thus-patterned capacitor dielectric layer (6), a capacitor conductor layer (8) formed of platinum and having a thickness of 0.2 μm was formed through sputtering. The capacitor conductor layer (8) will basically serve as the upper electrode of the capacitor.

(1-h) Thereafter, in order to pattern the capacitor conductor layer (8), portions of the capacitor conductor layer surface which were not to be etched were covered by an etching resist (9) (the bottom surface of the ceramic substrate for thin-film electronic components, on which surface no capacitor elements were formed, was also protected by the etching resist).

(1-i) Subsequently, etching was performed by ion milling to thereby pattern the capacitor conductor layer (8), and the etching resist (9) was removed.

(1-j) Thereafter, a solder resist layer (10) was formed.

(1-k) Subsequently, the solder resist layer (10) was patterned (through this patterning process, the surfaces of the via conductors were exposed).

(1-l) Thereafter, a nickel-gold plating layer (11) was formed, through electroless plating, on the surfaces of the via conductors (21) exposed in the step (1-k).

(1-m) Subsequently, solder balls (12) were formed on the surfaces of the nickel-gold plating layer (11) formed in the above step (1-l), to thereby produce a thin-film capacitor (100).

INDUSTRIAL APPLICABILITY

The present invention has wide applicability in fields related to electronic components. The ceramic substrate of the present invention for thin-film electronic components are employed as any type of substrate on which a thin-film electronic component (e.g., thin-film capacitor) is provided, and is particularly suitable for a capacitor incorporated into a wiring-built-in substrate. In addition, the ceramic substrate of the present invention for thin-film electronic components is suitably employed in a thin-film capacitor and, for example, as a wiring substrate on which a thin-film capacitor is provided.

It should further be apparent to those skilled in the art that various changes in form in detail of the invention as shown and described above may be made. It is intended that such changes be included within the spirit and scope of the claims appended hereto.

This application is based on Japanese Patent Application Number 2003-338699 filed Sep. 29, 2003, incorporated herein by reference in its entirety.

What is claimed is:

1. A ceramic substrate for thin-film electronic components, the substrate including a base ceramic substrate, a wiring pattern inside said base ceramic substrate, and a glaze layer formed on at least one surface of the base ceramic substrate, characterized in that the glaze layer has a surface having an arithmetical mean roughness (Ra) of 0.02 μm or less and a maximum height (Ry) of 0.25 μm or less;
wherein the ceramic substrate is formed by subjecting a glass layer formed on a surface of the base ceramic substrate to heating-and-pressurizing treatment, thereby forming a glaze layer on the base ceramic substrate, and planarization polishing the surface of the glaze layer;
wherein the planarization-polished surface of the glaze layer is adapted for forming the thin-film electronic components thereon; and
wherein the glaze layer has a thickness of 10 to 100 μm and has no pores.

2. The ceramic substrate for thin-film electronic components as claimed in claim 1, wherein the glaze layer is formed of a glass having a sag point of 700° C. or higher.

3. The ceramic substrate for thin-film electronic components as claimed in claim 1, wherein the glaze layer is formed of a glass containing as predominant components Si, Al, B, Ca and O.

4. A thin-film electronic component comprising a ceramic substrate for thin-film electronic components, the substrate including:
a base ceramic substrate, and a glaze layer formed on at least one surface of the base ceramic substrate, characterized in that the glaze layer has a surface having an arithmetical mean roughness (Ra) of 0.02 μm or less and a maximum height (Ry) of 0.25 μm or less;
wherein the ceramic substrate is formed by subjecting a glass layer formed on a surface of the base ceramic substrate to heating-and-pressurizing treatment, thereby forming a glaze layer on the base ceramic substrate, and planarization polishing the surface of the glaze layer;
wherein the planarization-polished surface of the glaze layer is adapted for forming the thin-film electronic components thereon; and
wherein the glaze layer has a thickness of 10 to 100 μm and has no pores;
which thin-film electronic component has a capacitor portion composed of capacitor conductive layers and a capacitor dielectric layer which are stacked on the ceramic substrate for thin-film electronic components, wherein the capacitor portion is formed by alternatingly stacking the capacitor conductive layers and the capacitor dielectric layer such that the capacitor dielectric layer is disposed between two of the capacitor conductor layers opposing each other.

5. A thin-film electronic component as claimed in claim 4, further comprising a via conductor penetrating the ceramic substrate and electrically connected to one or the other of the alternatingly stacked capacitor conductor layers.

6. A thin-film electronic component comprising a ceramic substrate for thin-film electronic components, characterized in that the substrate is formed by subjecting a glass layer formed on a surface of a base ceramic substrate to heating-and-pressurizing treatment, thereby forming a glaze layer on the base ceramic substrate, and planarization-polishing the surface of the glaze layer, and
wherein the glaze layer has a thickness of 10 to 100 μm and has no pores,
which thin-film electronic component has a capacitor portion composed of capacitor conductive layers and a capacitor dielectric layer which are stacked on the ceramic substrate for thin-film electronic components, wherein the capacitor portion is formed by alternatingly stacking the capacitor conductive layers and the capacitor dielectric layer such that the capacitor dielectric layer is disposed between two of the capacitor conductor layers opposing each other.

7. A thin-film electronic component as claimed in claim 6, further comprising a via conductor penetrating the ceramic substrate and electrically connected to one or the other of the alternatingly stacked capacitor conductor layers.

8. A thin-film electronic component, comprising a ceramic substrate for thin-film electronic components, the substrate including a base ceramic substrate, and a glaze layer containing no pores and formed on at least one surface of the base ceramic substrate, characterized in that a surface of the glaze layer has been planarization-polished, and
wherein the glaze layer has a thickness of 10 to 100 μm and has no pores,
which thin-film electronic component has a capacitor portion composed of capacitor conductive layers and a capacitor dielectric layer which are stacked on the ceramic substrate for thin-film electronic components, wherein the capacitor portion is formed by alternatingly stacking the capacitor conductive layers and the capacitor dielectric layer such that the capacitor dielectric layer is disposed between two of the capacitor conductor layers opposing each other.

9. A thin-film electronic component as claimed in claim 8, further comprising a via conductor penetrating the ceramic substrate and electrically connected to one or the other of the alternatingly stacked capacitor conductor layers.

10. A thin-film electronic component comprising a ceramic substrate for thin-film electronic components, the substrate including:
a base ceramic substrate, and a glaze layer formed on at least one surface of the base ceramic substrate, characterized in that the glaze layer has a surface having an arithmetical mean roughness (Ra) of 0.02 μm or less and a maximum height (Ry) of 0.25 μm or less;

wherein the ceramic substrate is formed by subjecting a glass layer formed on a surface of the base ceramic substrate to heating-and-pressurizing treatment, thereby forming a glaze layer on the base ceramic substrate, and planarization polishing the surface of the glaze layer;

wherein the planarization-polished surface of the glaze layer is adapted for forming the thin-film electronic components thereon; and wherein the glaze layer has a thickness of 10 to 100 μm and has no pores;

which thin-film electronic component has via conductor penetrating te ceramic substrate, a capacitor portion composed of capacitor conductive layers and a capacitor dielectric layer which arc stacked on the ceramic substrate for tin-film electronic components, wherein the capacitor portion is formed by alternatingly stacking te capacitor conductive layers and the capacitor dielectric layer such that the capacitor dielectric layer is disposed between two of the capacitor conductor layers opposing each other, the via conductor is electrically connected to one or the other of the alternatingly stacked capacitor conductive layers, and a surface of the via conductor electrically connected to one or te other of the capacitor conductive layers has an arithmetical mean roughness (Ra) of 0.02 μm or less and a maximum height (Ry) of 0.25 μm or less.

11. A method for producing a ceramic substrate for thin-film electronic components, said ceramic substrate including a base ceramic substrate, and a glaze layer formed on at least one surface of the base ceramic substrate, characterized in that the glass layer has a surface having an arithmetical mean roughness (Ra) of 0.02 μm or less and a maximum height (Ry) of 0.25 μm or less;

wherein the ceramic substrate is formed by subjecting a glass layer formed on a surface of the base ceramic substrate to heating-and-pressurizing treatment, thereby forming a glaze layer on the base ceramic substrate, and planarization polishing the surface of the glaze layer;

wherein the planarization-polished surface of the glaze layer is adapted for forming the thin-film electronic components thereon; and wherein the glaze layer has a thickness of 10 to 100 μm and has no pores;

which method comprises the following steps, in the order given:

forming a resist layer on a surface of a base ceramic substrate having an interior wiring pattern whose end surface is exposed to the surface of the substrate;

patterning the resist layer, thereby forming a patterning hole in communication with the end surface of the interior wiring pattern;

forming an end portion of the interior wiring pattern, the end portion being connected with the end surface of the interior wiring pattern, by filling the patterning hole with an electroconductive material;

removing the patterned resist layer;

forming a glass layer on a surface of the base ceramic substrate such that at least a portion of the end portion of the interior wiring pattern is buried with the glass layer;

performing heating-and-pressurizing treatment, thereby forming a glaze layer on a surface of the base ceramic substrate; and planarization-polishing a surface of the glaze layer to provide a flat surface, thereby exposing the end portion of the interior wiring pattern.

12. A method for producing a ceramic substrate for thin-film electronic components, said ceramic substrate including a base ceramic substrate, and a glaze layer formed on at least one surface of the base ceramic substrate, characterized in that the glaze layer has a surface having an arithmetical mean roughness (Ra) of 0.02 μm or less and a maximum height (Ry) of 0.25 μm or less;

wherein the ceramic substrate is formed by subjecting a glass layer formed on a surface of the base ceramic substrate to heating-and-pressurizing treatment, thereby forming a glaze layer on the base ceramic substrate, and planarization polishing the surface of the glaze layer;

wherein the planarization-polished surface of the glaze layer is adapted for forming the thin-film electronic components thereon; and wherein the glaze layer has a thickness of 10 to 100 μm and has no pores;

which method comprises the following steps, in the order given:

forming a glass layer on a base ceramic substrate having an interior wiring pattern whose end surface is exposed to the surface of the substrate;

performing heating-and-pressurizing treatment, thereby forming a glaze layer on the base ceramic substrate;

forming a resist layer on a surface of the glaze layer;

patterning the resist layer, thereby forming a patterning hole in corresponding with the end surface of the interior wiring pattern;

etching the glaze layer though the patterning hole, thereby forming an etching hole connecting with the end surface of the interior wiring pattern;

removing the patterned resist layer;

forming an end portion of the interior wiring pattern, the end portion being connected with the end surface of the interior wiring pattern, by filling the etching hole with an electroconductive material; and planarization-polishing a surface of the glaze layer to provide a flat surface, thereby exposing the end portion of the interior wiring pattern.

* * * * *